(12) United States Patent
Toyao et al.

(10) Patent No.: US 8,816,936 B2
(45) Date of Patent: Aug. 26, 2014

(54) ANTENNA AND PRINTED-CIRCUIT BOARD USING WAVEGUIDE STRUCTURE

(75) Inventors: Hiroshi Toyao, Tokyo (JP); Noriaki Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 591 days.

(21) Appl. No.: 12/457,802

(22) Filed: Jun. 22, 2009

(65) Prior Publication Data

US 2010/0214178 A1    Aug. 26, 2010

(30) Foreign Application Priority Data

Feb. 24, 2009   (JP) ................................ P2009-041356

(51) Int. Cl.
*H01Q 15/02*    (2006.01)
(52) U.S. Cl.
USPC .................................... 343/909; 343/700 MS
(58) Field of Classification Search
CPC ............................... H01Q 1/38; H01Q 15/008
USPC .......................................... 343/700 MS, 909
See application file for complete search history.

(56) References Cited

U.S. PATENT DOCUMENTS

| 4,835,540 | A | * | 5/1989 | Haruyama et al. ..... 343/700 MS |
| 5,598,168 | A | * | 1/1997 | Evans et al. ............ 343/700 MS |
| 2005/0019051 | A1 | | 1/2005 | Nozawa |
| 2005/0029632 | A1* | | 2/2005 | McKinzie et al. ............ 257/665 |
| 2005/0195051 | A1 | | 9/2005 | McKinzie, III |
| 2005/0205292 | A1 | | 9/2005 | Rogers et al. |
| 2006/0044210 | A1 | | 3/2006 | Ramprasad et al. |
| 2007/0176827 | A1 | | 8/2007 | Itoh et al. |
| 2007/0285336 | A1 | | 12/2007 | Kamgaing |
| 2008/0272977 | A1* | | 11/2008 | Gaucher et al. ............... 343/860 |

FOREIGN PATENT DOCUMENTS

| JP | 08139504 A | * | 5/1996 |
| JP | 2003-304113 A | | 10/2003 |
| JP | 2006-253929 | | 9/2006 |
| JP | 2006-253929 A | | 9/2006 |
| JP | 2007-522735 A | | 8/2007 |
| JP | 2008-236027 A | | 10/2008 |

(Continued)

OTHER PUBLICATIONS

Liu et al, Enhanced Bandwidth Uniplanar Compact Electromagnetic Bandgap Structure with Coplanar Meander Line Inductance, Electronics Letters Feb. 14, 2008 vol. 44 No. 4, pp. 260-261.*

(Continued)

*Primary Examiner* — Dieu H Duong
(74) *Attorney, Agent, or Firm* — McGinn IP Law Group, PLLC

(57) ABSTRACT

An antenna or a printed-circuit board is formed using a plurality of unit structures which are repetitively aligned in a one-dimensional manner or in a two-dimensional manner. The unit structure includes a conductive plane and a conductive patch which are disposed in parallel with each other, a power-supply unit applying a high frequency signal between the conductive plane and the conductive patch, and at least one shunt which is aligned in the conductive patch and which is constituted of a transmission line having an open end aligned in a plane above or below the conductive patch and a conductive via electrically connecting the transmission line to the conductive plane. Alternately, the transmission line is aligned in a plane above or below the conductive plane so that the transmission line is electrically connected to the conductive patch via the conductive via.

2 Claims, 31 Drawing Sheets

(56) References Cited

FOREIGN PATENT DOCUMENTS

| JP | 2009-21594 A | 1/2009 |
| JP | 2010-10183 A | 1/2010 |
| WO | WO 2008/062562 A1 | 5/2008 |

OTHER PUBLICATIONS

Li Yang, et al., "A Spiral Electromagnetic Bandgap (EBG) Structure and its Application in Microstrip Antenna Arrays" Microwave Conference Proceedings, 2005; APMC 2005, Asia-Pacific Conference Proceedings, Suzhou, China Dec. 4-7, 2005, Piscataway, NJ, USA, IEEE, vol. 3, Dec. 4, 2005, pp. 1-4, XP010902238, ISBN: 978-0-7803-9433-9.

Extended European Search Report dated Jul. 23, 2010, in EPO Application No. 09163463.4-1248.

Japanese Notice of Allowance dated Jun. 25, 2013 with partial English translation thereof.

Japanese Office Action dated Mar. 12, 2013 with English translation thereof.

\* cited by examiner

ANTENNA AND PRINTED-CIRCUIT BOARD USING WAVEGUIDE STRUCTURE

BACKGROUND OF THE INVENTION

1. Field of the Invention

The present invention relates to waveguide structures for use in propagation of electromagnetic waves such as microwaves and millimeter waves, and in particular to electromagnetic-band-gap (EBG) structures for suppressing propagation of electromagnetic waves in specific frequency bands. Specifically, the present invention relates to antennas and printed-circuit boards using waveguide structures as well as electronic devices including printed-circuit boards.

The present application claims priority on Japanese Patent Application No. 2009-41356, the content of which is incorporated herein by reference.

2. Description of the Related Art

Various technologies regarding waveguide structures, printed-circuit boards, and antennas for preventing propagation of electromagnetic waves in specific frequency bands have been developed and disclosed in various documents.

Patent Document 1: U.S. Patent Application Publication, US 2005/019051 A1

Patent Document 2: U.S. Patent Application Publication, US 2005/0205292 A1

Patent Document 3: U.S. Patent Application Publication, US 2007/0176827 A1

Recently, methods for artificially controlling frequency dispersions of electromagnetic waves by use of repetitively aligned conductive patches have been provided. Among those structures, structures having band gaps in frequency dispersions are referred to as EBG structures, which are expectedly applied to filters for suppressing propagation of unwanted noise in printed-circuit boards or substrates of device packages.

Patent Document 1 teaches an EBG structure for reducing noise propagating between parallel plates. The EBG structure includes conductive patches which are aligned in a third layer between parallel plates and which serve as capacitances for one conductive plane of the parallel plates, and shunts (or admittances) for connecting the conductive patches to another conductive plane of the parallel plates, wherein the shunts are repetitively aligned in a one-dimensional manner or a two-dimensional manner along the parallel plates. Due to band gaps occurring in frequency bands in which the shunts serve as inductances in the EBG structure, it is possible to set band gaps by controlling serial-LC resonance frequencies of shunts.

Securing adequate capacitances and inductances in the above EBG structure leads to increasing the areas of conductive patches or increasing the lengths of conductive vias, which in turn makes it difficult to reduce the sizes of structures.

Patent Document 2 teaches a structure in which chip capacitors are mounted on the surface and are connected in parallel between conductive planes and conductive patches. This structure increases capacitances without increasing the areas of conductive patches.

However, Patent Document 2 discloses that using chip capacitors increases the number of parts so as to increase the manufacturing cost.

In the above circumstances, the inventor has recognized that it is necessary to fabricate an EBG structure (or a waveguide structure) and a printed-circuit board with a reduced size, without using chip components, and with low manufacturing cost.

Conventionally, flat panel antennas for microwaves and millimeter waves have been developed, and in particular, small-size and low-frequency antenna structures using the meta-material technology have been developed. This technology is advantageous in reducing sizes of wireless communication devices for use in reception/transmission of electromagnetic waves such as microwaves and millimeter waves.

The relationship between the wave number (or wavelength) and the frequency in electromagnetic waves propagating through dielectric media are referred to as dispersion characteristics of media. Recently, meta-material technologies in which conductive patterns or conductive structures are repetitively aligned so as to artificially control the dispersion characteristics in propagation of electromagnetic waves through structures have been developed and studied in various application fields of engineering.

It is possible to reduce the size of antennas by use of the meta-material technology. Patent Document 3 teaches a small-size antenna structure based on composite right-handed or left-handed (CRLH) principles showing the right-handed property or the left-handed property due to the operating frequency.

The antenna of Patent Document 3 employs a CRLH line structure repetitively aligning a plurality of unit structures including conductive planes, conductive patches disposed in parallel with conductive planes, and conductive vias connected between conductive planes and conductive patches, thus utilizing a length-related resonance of the CRLH line structure in the left-handed frequency range. Conventional media (e.g. right-handed media) suffers from the large size of an antenna structure because the wavelength of electromagnetic waves becomes longer as the frequency becomes lower. In contrast, left-handed media is capable of reducing the size of an antenna structure because the wavelength of electromagnetic waves becomes shorter as the frequency becomes lower.

Patent Document 3 teaches that for the purpose of lowering the frequency range securing the operation of left-handed media, a conductive element is arranged between the conductive plane and the conductive patch so as to increase the capacitance formed between adjacent conductive patches. For the same purpose, a slit is formed in proximity to the connection between the conductive plane and the conductive via so as to form a coplanar line, thus increasing the inductance formed between the conductive plane and the conductive patch.

The inventor has recognized that the left-handed media of Patent Document 3 using the repetitive structure cannot operate as antennas in low frequency range under cutoff frequencies thereof. In short, the antenna structure of Patent Document 3 suffers from the limitation in lowering frequencies. For this reason, it is difficult to design small-size antennas operating in low frequencies based on the conventional technology.

SUMMARY

The present invention seeks to solve the above problem, or to improve upon the problem at least in part.

The present invention is directed to an antenna or a printed-circuit board, which includes a plurality of unit structures repetitively aligned in a one-dimensional manner or in a two-dimensional manner. The present invention is also directed to an electronic device incorporating the antenna and/or the printed-circuit board.

The unit structure is constituted of a first conductive plane and a second conductive plane which are disposed in parallel with each other, a power-supply unit applying a high frequency signal between the first conductive plane and the second conductive plane, and at least one shunt which is aligned in the second conductive plane and which is constituted of a transmission line having an open end aligned in a plane above or below the second conductive plane and a conductive via electrically connecting the transmission line to the first conductive plane.

Alternately, the unit structure is constituted of a first conductive plane and a second conductive plane which are disposed in parallel with each other, a power-supply unit applying a high frequency signal between the first conductive plane and the second conductive plane, and at least one shunt which is aligned in the second conductive plane and which is constituted of a transmission line having an open end aligned in a plane above or below the first conductive plane and a conductive via electrically connecting the transmission line to the second conductive plane.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following description regarding waveguide structures and printed-circuit boards according to the present invention with reference to the accompanying drawings, a vertical direction in FIG. 1 will be referred to as a thickness direction of a board.

1. First Embodiment

Figure 1:
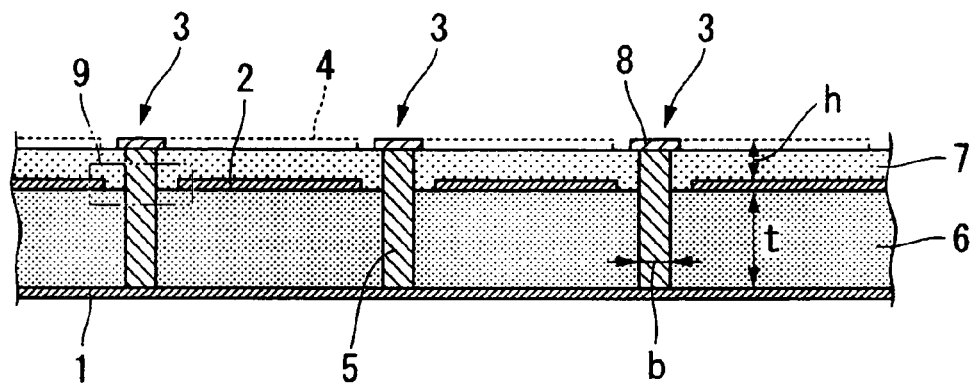
FIG. 1 is a cross-sectional view of an EBG structure used for explaining a waveguide structure according to a first embodiment of the present invention.
Figure 2:
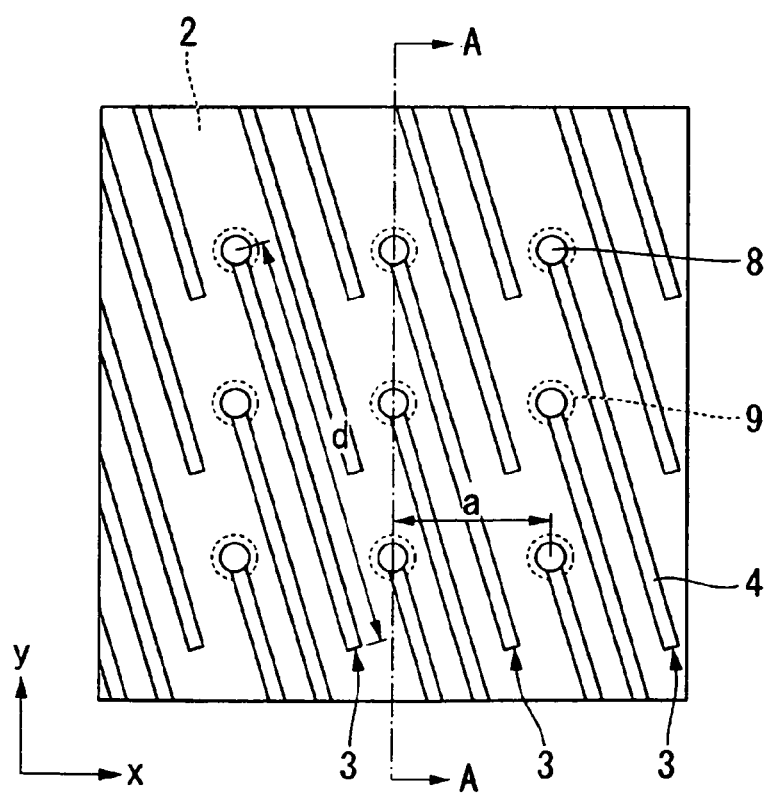
FIG. 2 is a plan view of the EBG structure corresponding to the waveguide structure of the first embodiment.

FIG. 1 is a cross-sectional view of an EBG structure according to a first embodiment. FIG. 2 is a plan view of the EBG structure; and FIG. 1 is a cross-sectional view taken along line A-A in FIG. 1.

The EBG structure (or the waveguide structure) of the first embodiment is a parallel-plate conductive structure; as shown in FIG. 1, and includes first and second conductive planes 1 and 2, which are aligned in parallel with a distance therebetween in the thickness direction, as well as a unit structure 3. The unit structure 3 includes a transmission line 4, which is laid in a layer different from the layers of the first and second planes 1 and 2, and a conductive via 5 for electrically connecting the transmission line 4 and the first conductive plane 1.

Specifically, the EBG structure includes a first dielectric layer 6, and a second dielectric layer 7 which is disposed on an upper surface of the first dielectric layer 6 in the thickness direction, wherein the first conductive plane 1 is disposed on a lower surface of the first dielectric layer 6 in the thickness direction, and the second conductive plane 2 is disposed between the first dielectric layer 6 and the second dielectric layer 7. The conductive via 5 is elongated in the thickness direction from the upper surface of the second conductive plane 2 to the lower surface of the first conductive plane 1. The transmission line 4 is disposed on the upper surface of the second dielectric layer 7 in the thickness direction. That is, the transmission line 4 is disposed to face the second conductive plane 2 outside a region circumscribed between the first conductive plane 1 and the second conductive plane 2.

The transmission line 4 uses the second conductive plane 2 as a return path, wherein one end thereof (i.e. a right-side end in FIG. 1) serves as an open end so that the transmission line 4 serves as an open stub. The other end of the transmission line 4 (i.e. a left-side end in FIG. 1) is electrically connected to a pad 8 which is formed in the same plane as the transmission line 4 and which is electrically connected to the first conductive plane 1 via the conductive via 5 elongated in the thickness direction. The second conductive plane 2 is equipped with a clearance 9 which overlaps with the conductive via 5 in position, so that the conductive via 5 is electrically isolated from and is not brought into contact with the second conductive plane 2 by means of the clearance 9.

In the above EGB structure, the transmission line 4, the conductive via 5, and the pad 8 are devoted to a shunt, which is combined with the clearance 9 so as to form the unit structure 3. One or more unit structures 3 are repetitively aligned at a lattice point defined by an independent vector A=(A1, A2) and B=(B1, B2) on the X-Y plane. The first embodiment exemplarily refers to a tetragonal lattice defined by A=(a,0) and B=(0,a) shown in FIG. 2 as a basic-mode lattice point. In the first embodiment, the transmission line 4 is inclined to the tetragonal lattice of A=(a,0) and B=(0,a) by a certain angle, wherein it is possible to secure a long length d with respect to the transmission line 4 without interfering with the clearance 9 in its periphery. Strictly speaking, the transmission line 4 is not included in the cross-section taken along line A-A in FIG. 2; for the sake of convenience, the transmission lines 4 are illustrated using dotted lines in FIG. 1. For the sake of convenience, FIG. 2 shows the second conductive plane 2 via the perspective scope of the second dielectric layer 7.

Next, a basic operating principle of the above EBG structure will be described.

Figure 3:
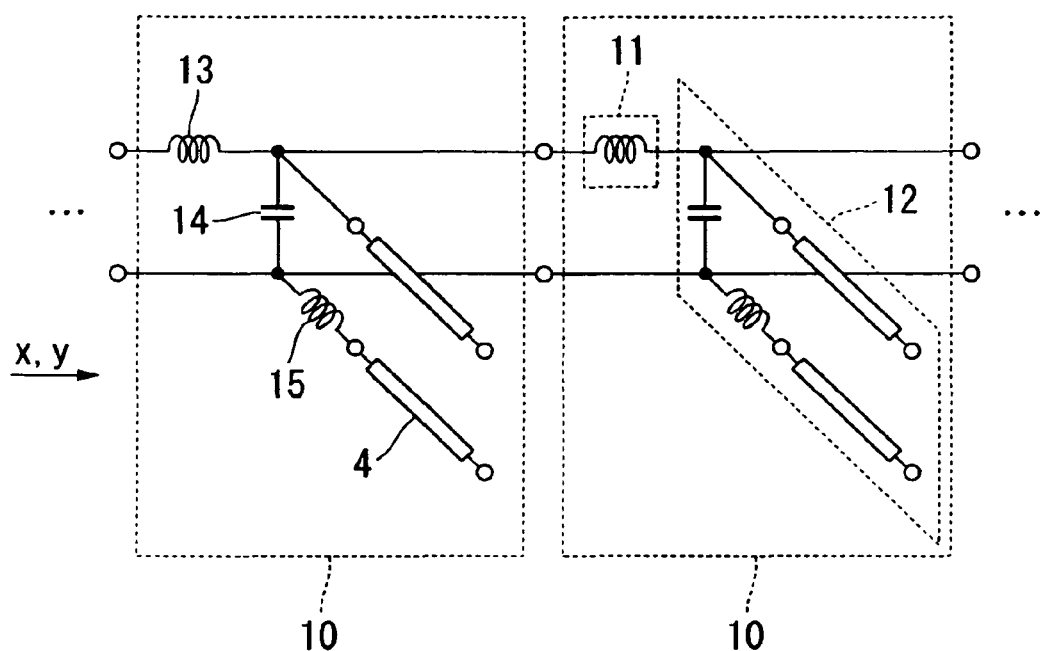
FIG. 3 is a circuit diagram showing an equivalent circuit of the EBG structure.
Figure 4:
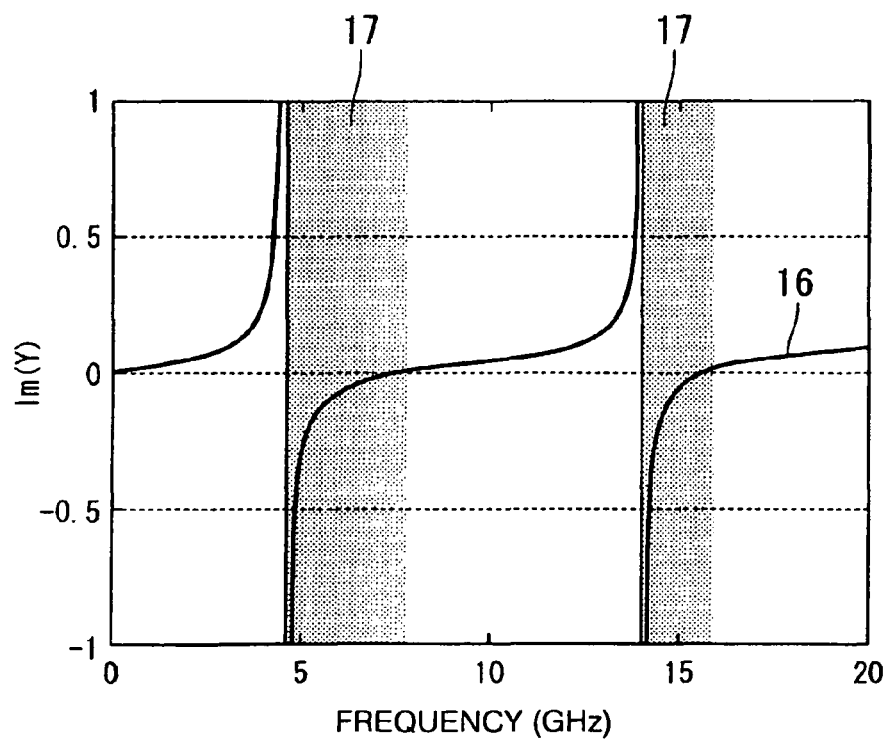
FIG. 4 is a graph plotting the imaginary part of admittance in the EBG structure.
Figure 5:
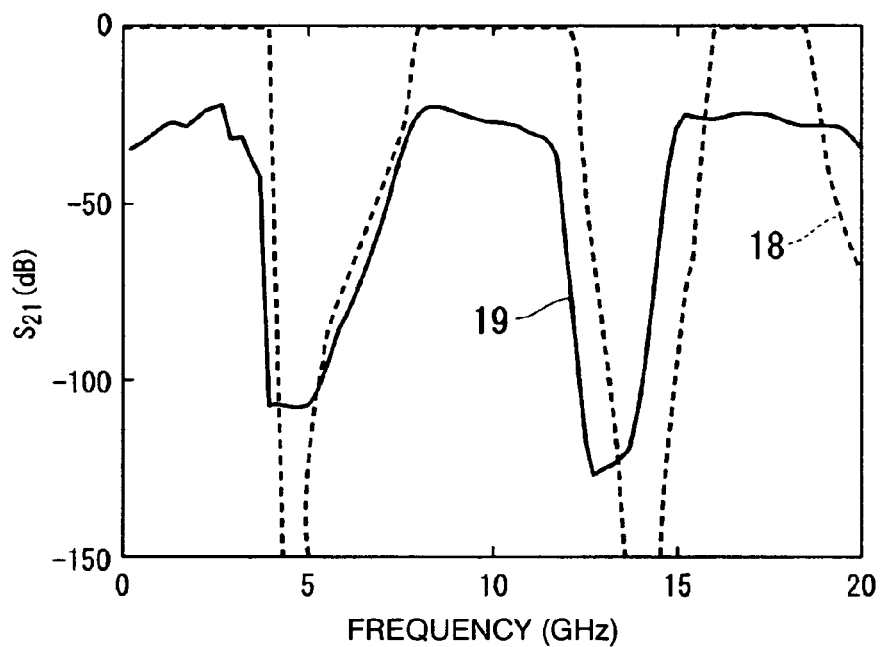
FIG. 5 is a graph showing calculation results regarding insertion loss in propagation of electromagnetic waves through the EBG structure.

FIG. 3 shows an equivalent circuit along the X-axis or Y-axis in FIG. 2. FIG. 4 is a graph for plotting the imaginary part of a parallel shunt. FIG. 5 is a graph showing calculation results regarding an insertion loss in propagation of electromagnetic waves through the EBG structure of the first embodiment.

Each repetitive unit 10 of the equivalent circuit shown in FIG. 3 is constituted of a serial impedance 11 and a parallel shunt 12. The serial impedance includes an inductance 13 formed between the first and second conductive planes 1 and 2. The parallel shunt 12 includes a capacitance 14 formed between the first and second conductive planes 1 and 2, an inductance 15 of the conductive via 5, and the transmission lines 4. The overall equivalent circuit of the EBG structure is formed by repetitively connecting one or more repetitive units 10.

In the EBG structure, band gaps occur in frequency bands in which the parallel shunts 12 serve as inductances. An admittance Y representative of the parallel shunt 12 is given by equation (1).

$$Y = \frac{1}{Z_{in} + i\omega L_{via}} + i\omega C_{plane} \qquad (1)$$

Y: Admittance
$Z_{in}$: Input impedance of the transmission line 4 in view of the pad 8
ω: Angular frequency
$L_{via}$: Inductance
$C_{plane}$: Capacitance The input impedance $Z_{in}$ of the transmission line 4 in view of the pad 8 is given by equation (2).

$$Z_{in} = Z_0 \times \frac{Z_T + iZ_0\tan(\beta d)}{Z_0 + iZ_T\tan(\beta d)} \qquad (2)$$

$$\beta = \omega\sqrt{\varepsilon_{eff}\varepsilon_0\mu_0}$$

$Z_{in}$: Input impedance of the transmission line 4 in view of the pad 8
$Z_0$: Characteristic impedance
$Z_T$: Terminating resistance
d: Length of the transmission line
ω: Angular frequency
$\varepsilon_{eff}$: Effective dielectric constant
$\varepsilon_0$: Dielectric constant of a vacuum
$\mu_0$: Magnetic permeability of a vacuum FIG. 4 shows frequency-dependent impedance curves 16 based on the imaginary part of the admittance Y calculated by equations (1) and (2) using parameters such as the capacitance 14 of 0.73 pF, the inductance 15 of 0.22 nH, the characteristic impedance of 20.25Ω of the transmission line 4, the length d=7.5 mm of the transmission line 4, and the effective dielectric constant $\varepsilon_{eff}$=3.47 of the transmission line 4. The transmission line 4 is of an open-end type so that the terminating resistance $Z_T$ thereof is presumed to be infinite. Due to an impedance-converting effect of the transmission line 4, the capacitive property (where Im(Y)>0) and the inductive property (where Im(Y)<0) alternately emerge in the impedance Im(Y) based on the admittance Y. In FIG. 4, the impedance Im(Y) becomes negative in frequency bands 17, thus showing the inductive property. For this reason, it is anticipated that band gaps may likely occur in the frequency bands 17.

In the EBG structure, a physical structure corresponding to the repetitive unit 10 of the equivalent circuit is repetitively aligned at the lattice point defined by a certain lattice distance "a" on the X-Y plane. Due to a repetitive boundary condition imposed on the repetitive unit 10 of the equivalent circuit shown in FIG. 3, it is necessary to calculate band gaps in consideration of the structural repetitiveness. FIG. 5 shows calculation results regarding an insertion loss (S21) in propagation of electromagnetic waves through the EBG structure by a distance of 7×a. A dotted curve 18 shown in FIG. 5 shows the calculation result which is produced by imposing the repetitive boundary condition on the repetitive unit 10 of the equivalent circuit while using the same parameters of circuit components used for producing calculation results of FIG. 4. A solid curve 19 shown in FIG. 5 shows the result of numerical calculation by way of three-dimensional electromagnetic analysis. A model subjected to electromagnetic analysis is designed with prescribed structural dimensions, such as the thickness t=400 μm of the first dielectric layer 6, the thickness h=60 μm of the second dielectric layer 7, the width b=300 μm of the conductive via 5, and the length d=7.5 mm of the transmission line 4. FIG. 5 shows that calculated band gaps of the equivalent circuit significantly match the result of electromagnetic analysis.

Calculated frequency bands of band gaps shown in FIG. 5 significantly match the frequency bands 17 shown in FIG. 4. This indicates that frequency bands of band gaps occurring in the EBG structure can be approximately illustrated by frequency characteristics of admittances. Since the admittance Y of the parallel shunt 12 is determined by equations (1) and (2), it is possible to bring band gaps into desired frequency bands by appropriately setting parameters of these equations. In particular, the length d of the transmission line 4 has a relatively high degree of freedom in designing; hence, it is possible to easily control band gaps by varying the length d. Frequencies of band gaps can be lowered by increasing the length d of the transmission line 4 but without necessarily changing its area; hence, it is possible to reduce the mounting area of the EBG structure. Since the EBG structure does not need chip components, it is possible to reduce the manufacturing cost in comparison with the conventional arts.

Figure 6:
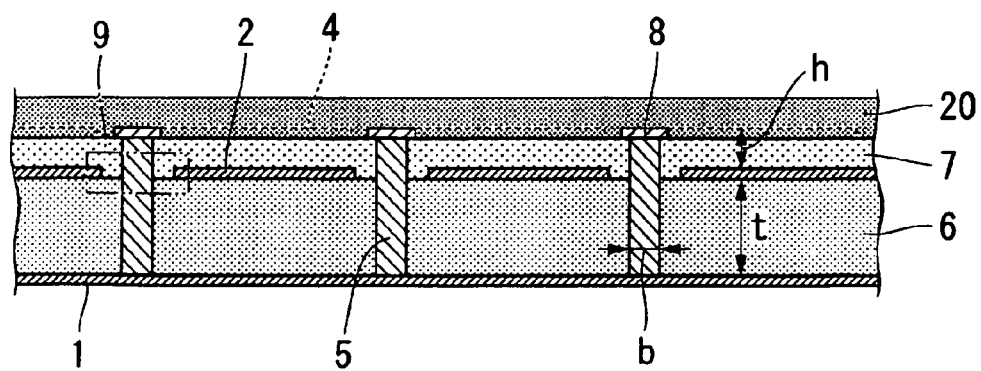
FIG. 6 is a cross-sectional view showing an EBG structure including an additional dielectric layer deposited above transmission lines.

First embodiment of FIG. 1 shows that no structure exists above the transmission lines 4, whereas it is possible to modify it such that a certain structure is mounted on the transmission lines 4. As shown in FIG. 6, for example, it is possible to arrange an additional dielectric layer (i.e. a third dielectric layer 20) above the transmission lines 4, thus increasing the effective dielectric constant of the transmission line 4. Equation (2) indicates that the impedance converting effect appears markedly on the transmission line 4 as the effective dielectric constant of the transmission line 4 becomes higher; hence, it is possible to lower the frequencies of band gaps without increasing the length d of the transmission line 4. For lowering frequencies of band gaps, it is preferable to use a dielectric material having a high dielectric constant for the third dielectric layer 20. For not lowering frequencies of band gaps, it is possible to use any type of dielectric materials for additional dielectric layers deposited above the transmission lines 4.

As long as one end of the transmission line 4 serves as an open end while the other end is connected to the pad 8, it is possible to employ any type of arrangements and shapes to the transmission lines 4, which do not affect the inherent property of the present invention.

Figure 7A:
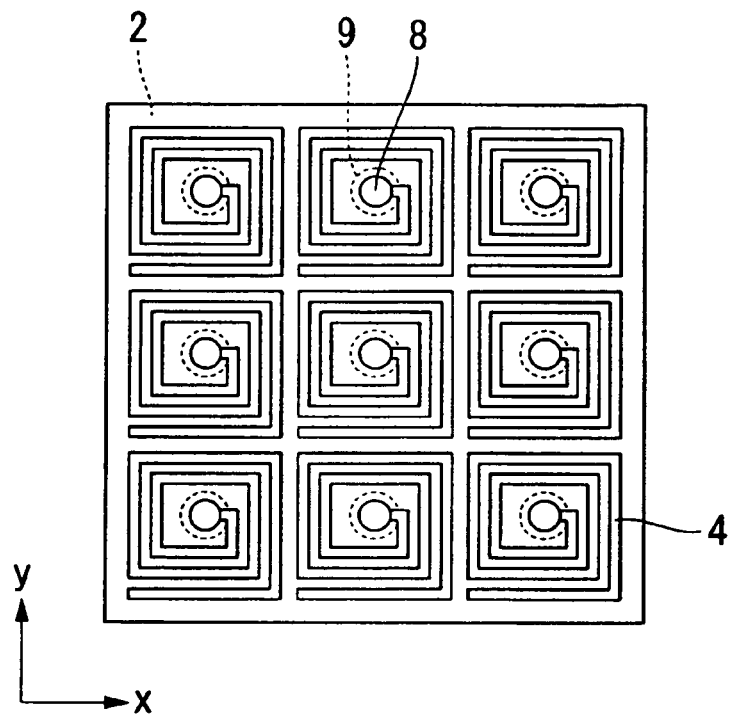
FIG. 7A is a plan view showing spiral-shaped transmission lines.
Figure 7B:
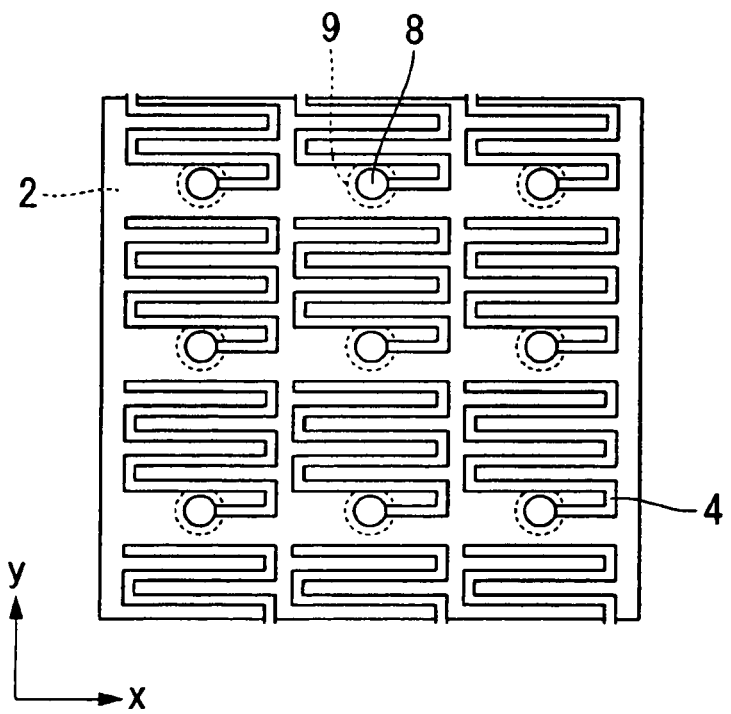
FIG. 7B is a plan view showing meandering transmission lines.

In the first embodiment, as shown in FIG. 2, the transmission lines 4 are inclined to the X-axis and Y-axis with certain angles therebetween so as not to interfere with the clearances 9 in their periphery, whereas they can be aligned in parallel with the X-axis and Y-axis without interference with the clearances 9. Although the first embodiment is designed such that the transmission lines 4 are linearly elongated as shown in FIG. 2, it is possible to employ the spiral shapes shown in FIG. 7A or the meandering shapes shown in FIG. 7B, for example. These examples adequately secure the length d of the transmission line 4 within a small mounting area.

Figure 27:
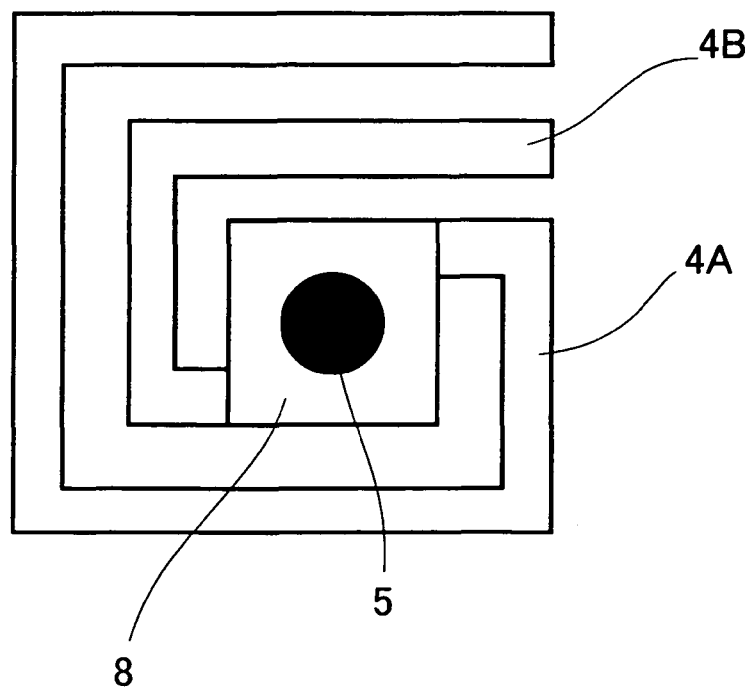
FIG. 27 is a fragmentary plan view showing a variation of the first embodiment.

It is possible to design an EBG structure shown in FIG. 27 in which two transmission lines 4A and 4B of different lengths having respective open ends are connected to the pad 8. In the EBG structure of FIG. 27 in which the transmission lines 4A and 4B differ from each other in terms of impedance conversion periods, it is possible to independently set a plurality of band gaps, thus securing a high degree of freedom in setting frequency bands. Herein, it is not necessary that the transmission line 4B be directly connected to the pad 8;

hence, it is possible to create another structure including ramification in which the transmission line 4B is ramified from the intermediate point of the transmission line 4A, for example.

Figure 8:
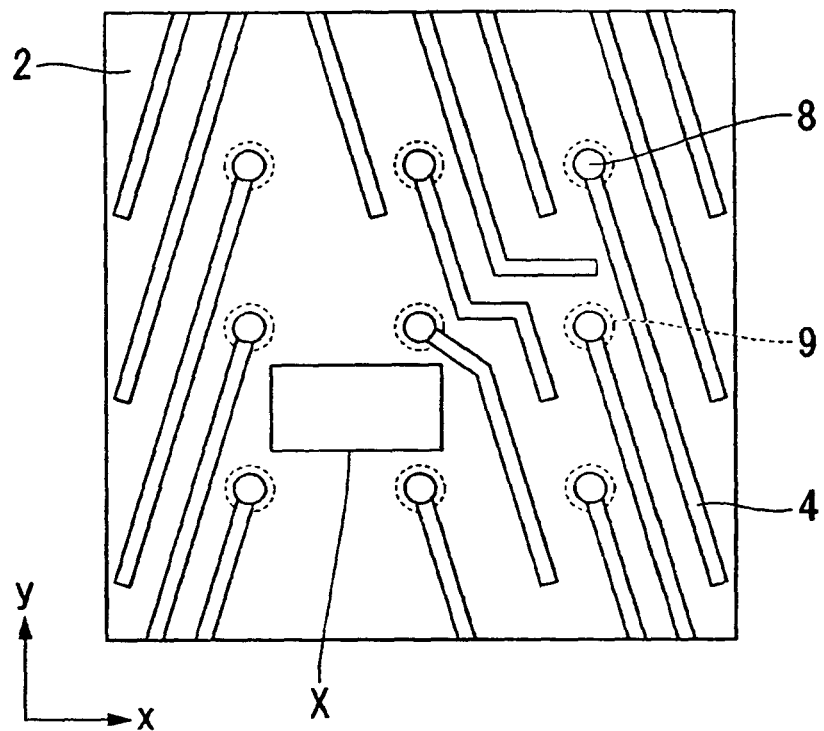
FIG. 8 is a plan view showing an EBG structure in which transmission lines are aligned to detour around a component X.

The transmission lines 4 are not necessarily aligned with the same arrangement and the same shapes shown in FIG. 2 in connection with all the unit structures 3. For example, it is possible to align the transmission lines 4 while avoiding a component X mounted on the surface as shown in FIG. 8, thus securing high-density packaging.

FIG. 2 shows the tetragonal lattice as the lattice point for repetitively aligning the unit structure 3; but this is not a restriction. For example, it is possible to employ triangular lattices or a one-dimensional repetitive alignment, thus demonstrating satisfactory effects.

For the sake of convenience in manufacturing, the pads 8 are aligned in connection with the transmission lines 4 and the conductive vias 5, whereas it is possible to modify the EBG structure not including the pads 8 without affecting the inherent properties of the present invention.

2. Second Embodiment

Next, a waveguide structure according to a second embodiment of the present invention will be described with reference to FIG. 9.

Figure 9:
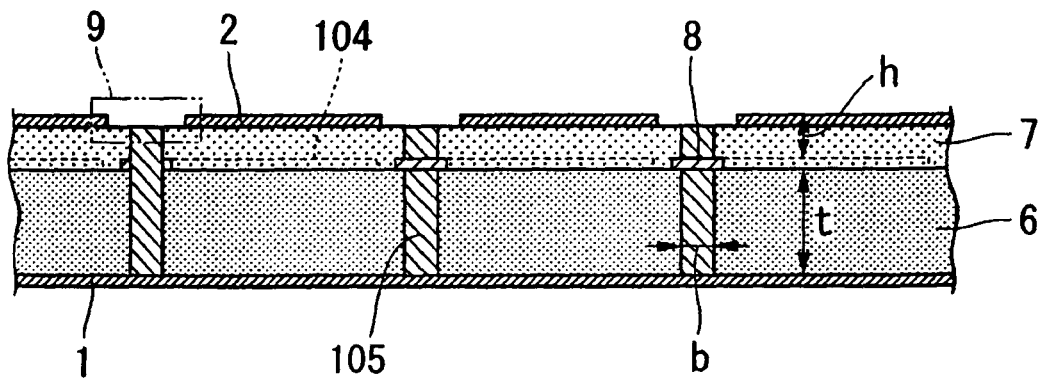
FIG. 9 is a cross-sectional view of an EBG structure used for explaining a waveguide structure according to a second embodiment of the present invention.

FIG. 9 is a cross-sectional view showing an EBG structure according to the second embodiment.

The EBG structure of the second embodiment is a variation of the EBG structure of the first embodiment, wherein parts identical to those of the first embodiment are designated by the same reference numerals, thus avoiding duplicate descriptions thereof.

The EGB structure of the second embodiment shown in FIG. 9 is characterized in that a transmission line 4 is embedded inside the region sandwiched between the first conductive plane 1 and the second conductive plane 2. Specifically, the first conductive plane 1 is attached to the lower surface of the first dielectric layer 6 in its thickness direction while the second conductive plane 2 is attached to the upper surface of the second dielectric layer 7 in its thickness direction in the EBG structure of the second embodiment. The transmission line 104 which uses the second conductive plane 2 as a return path is laid in the intermediate layer circumscribed between the first dielectric layer 6 and the second dielectric layer 7.

Similar to the transmission line 4 for use in the first embodiment, one end of the transmission line 104 is an open end, thus serving as an open stub. The other end of the transmission line 104 is connected to the pad 8 which is positioned in the same plane as the transmission line 104, wherein the pad 8 is electrically connected to the first conductive plane 1 via a conductive via 105. Similar to the first embodiment, the pad 8, the transmission line 104, and the conductive via 105 serve as an shunt, which is combined with the clearance arranged for the second conductive plane 2 so as to form the unit structure 3. The arrangement of the unit structure 3 as well as the arrangement and shape of the transmission line 104 employed in the second embodiment are similar to those employed in the first embodiment.

Since the transmission line 104 is shielded by the first and second conductive planes 1 and 2 in the EBG structure of the second embodiment, it is possible to reduce the number of unwanted electromagnetic waves being emitted from the transmission line 104 to the exterior surface.

Figure 10:
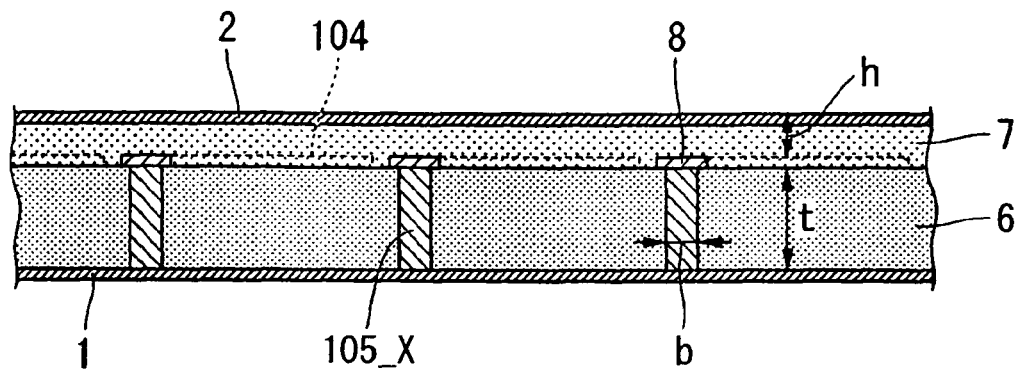
FIG. 10 is a cross-sectional view showing a variation of the EBG structure shown in FIG. 9.

FIG. 9 shows the second embodiment in which the conductive via 105 is a through-via; but this is not a restriction as long as the pad 8 is electrically connected to the first conductive plane 1. As shown in FIG. 10, for example, it is possible to arrange a conductive via 105_X of a non-through-via type without affecting the property of the present invention. Since the EBG structure shown in FIG. 10 does not need the clearance 9 for the second conductive plane 2, it is possible to eliminate electromagnetic waves from being emitted from the clearance 9 to the exterior surface.

Next, an EBG structure according to a further variation of the second embodiment will be described with reference to FIG. 28.

Figure 28:
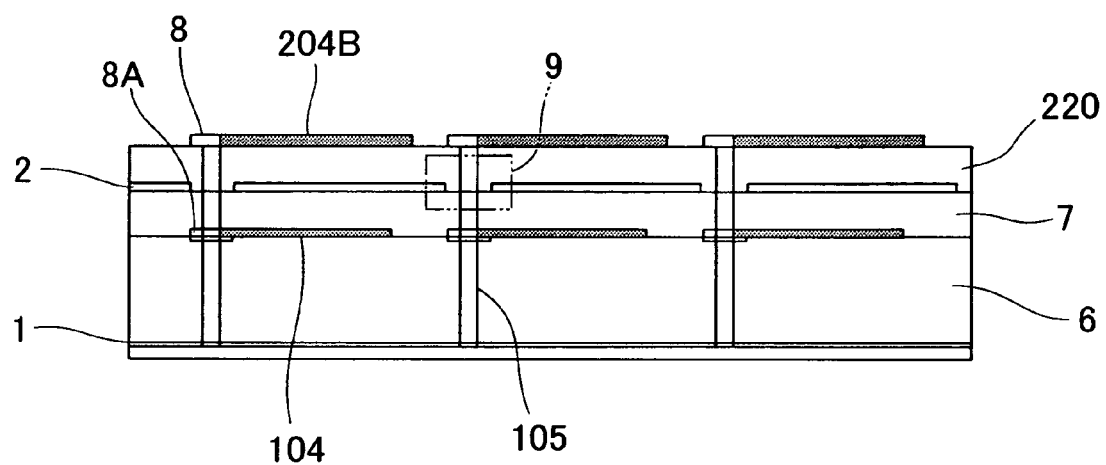
FIG. 28 is a cross-sectional view showing a further variation of the second embodiment.

The EBG structure of FIG. 28 is designed based on the EBG structure of FIG. 9, wherein a third dielectric layer 220 is disposed above the second conductive plane 2, and a second transmission line 204B having an open end is disposed above the third dielectric layer 220. The upper end of the conductive via 105 is left-side end of the second transmission line 204B laid on the third dielectric layer 220 via the pad 8, while the right-side end of the second transmission line 204B is an open end. The clearance 9 is formed at the position of the conductive via 105 in the second conductive plane 2, which is not electrically connected to the conductive via 105. IN the EBG structure of FIG. 28, the transmission line 104 and the second transmission line 204B operate as open stubs independently. When the transmission line 104 and the second transmission line 204B are designed to have different lengths, it is possible to secure different impedance conversion periods therefor, in other words, it is possible to set a plurality of band gaps independently, thus securing a high degree of freedom in setting frequency bands. Similar to the foregoing embodiments, it is possible to arrange various patterns with respect to the arrangement and shape regarding the transmission line 104 and the second transmission line 204B; that is, it is possible to employ spiral shapes or meandering shapes, for example.

3. Third Embodiment

Next, a waveguide structure according to a third embodiment of the present invention will be described with reference to FIG. 11.

Figure 11:
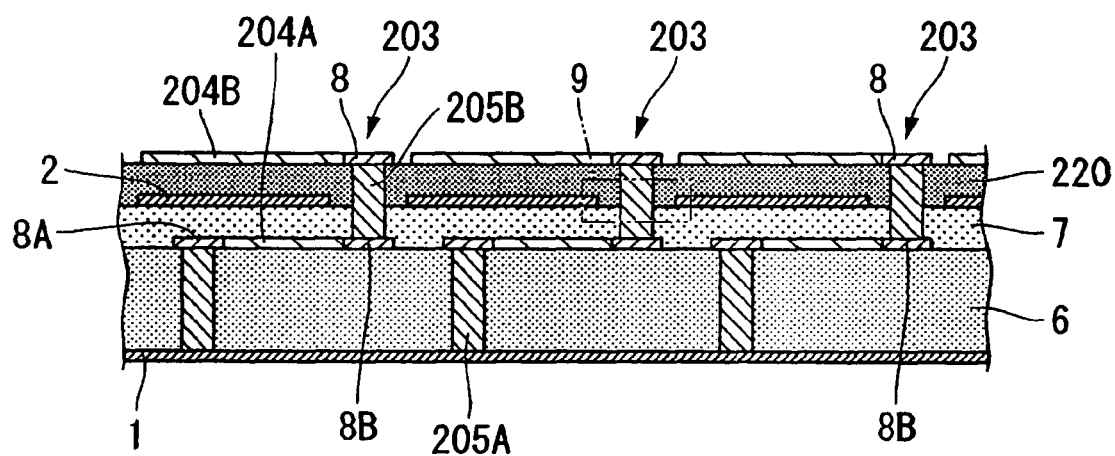
FIG. 11 is a cross-sectional view of an EBG structure used for explaining a waveguide structure according to a third embodiment of the present invention.

FIG. 11 is a cross-sectional view showing an EBG structure according to the third embodiment.

The EBG structure of the third embodiment is a variation of the EBG structure of the second embodiment, wherein parts identical to those of the second embodiment are designated by the same reference numerals, thus avoiding duplicate descriptions thereof.

The EBG structure of the third embodiment shown in FIG. 11 is formed using a unit structure 203 including a first transmission line 204A laid between the first conductive plane 1 and the second conductive plane 2, a second transmission line 204B positioned to face the second conductive plane 2 to outside a region circumscribed between the first conductive plane 1 and the second conductive plane 2, a first conductive via 205A for electrically connecting one end of the first transmission line 204A (i.e. a left-side end in FIG. 11) to the first conductive plane 1, and a second conductive via 205B for electrically connecting the other end of the first transmission line 204A (i.e. a right-side end in FIG. 11) to the second transmission line 204B.

Similar to the second embodiment, the third embodiment is designed such that the first conductive plane 1 is attached to the lower surface of the first dielectric layer 6 in its thickness direction while the second conductive plane 2 is attached to the upper surface of the second dielectric layer 7 in its thickness direction. A third dielectric layer (i.e. a surface dielectric layer 220) for covering the second conductive plane 2 is deposited on the upper surface of the second dielectric layer 7. The first transmission line 204A is aligned at the position of the transmission line 104 used in the second embodiment (i.e. the position between the first dielectric layer 6 and the second dielectric layer 7), while the second transmission line 204B whose one end is an open end is aligned on the upper surface of the surface dielectric layer 220 in its thickness direction. The first transmission line 204A uses the second conductive plane 2 as a return path, wherein pads 8A and 8B which are aligned in the same plane as the first transmission line 204A are electrically connected to the opposite ends of the first transmission line 204A. The second transmission line 204B uses the second conductive plane 2 as a return path, wherein one end of the second transmission line 204B is an open end, thus serving as an open stub. The other end of the second transmission line 204B is electrically connected to the pad 8 which is aligned in the same plane as the second transmission line 204B.

The pad 8A attached to the first transmission line 204A is electrically connected to the first conductive plane 1 via a first conductive via 205A which is elongated in the thickness direction. The pad 8B attached to the first transmission line 204A is electrically connected to the pad 8 attached to the second transmission line 204B via a second conductive via 205B which is elongated in the thickness direction. The clearance 9 is arranged for the second conductive plane 2 in connection with the second conductive via 205B, so that the second conductive plane 2 is electrically isolated from and is prevented from contacting the second conductive via 205B by means of the clearance 9.

Since the first transmission line 204A laid in the intermediate layer and the second transmission line 204B laid in the surface layer collectively serve as an open stub in the EBG structure of the third embodiment, it is possible to secure an adequate transmission-line length d within a small area in packaging.

Similar to the first and second embodiments, various patterns can be created in terms of the arrangement and shapes of the first and second transmission lines 204A and 204B. It is possible to employ spiral shapes or meandering shapes, for example. Thus, it is possible to produce the EBG structure which can be mounted on a small area in packaging.

Figure 12:
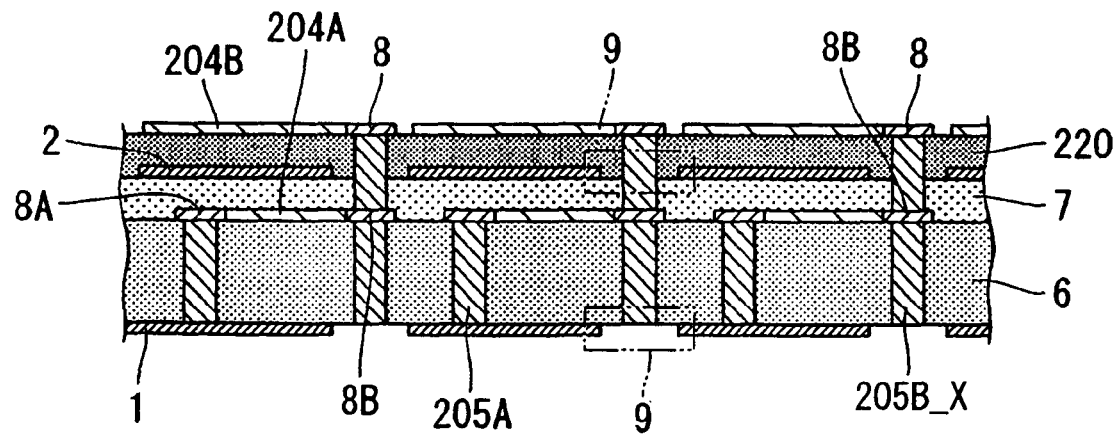
FIG. 12 is a cross-sectional view showing a variation of the EBG structure shown in FIG. 11.

FIG. 11 shows the third embodiment in which both the first and second conductive vias 205A and 205B are of a non-through-via type, whereas it is possible to use through vias. As shown in FIG. 12, for example, it is possible to replace the second conductive via 205B with another second conductive via 205B_X serving as a through via. In the EBG structure shown in FIG. 12, the clearance 9 is formed at a prescribed position corresponding to the second conductive via 205B_X in relation to the first conductive plane 1, thus preventing the first conductive plane 1 from being electrically connected to the second conductive plane 2. In addition, it is possible to use a through via as the first conductive via 205A.

4. Fourth Embodiment

Next, a waveguide structure according to a fourth embodiment of the present invention will be described with reference to FIG. 13.

Figure 13:
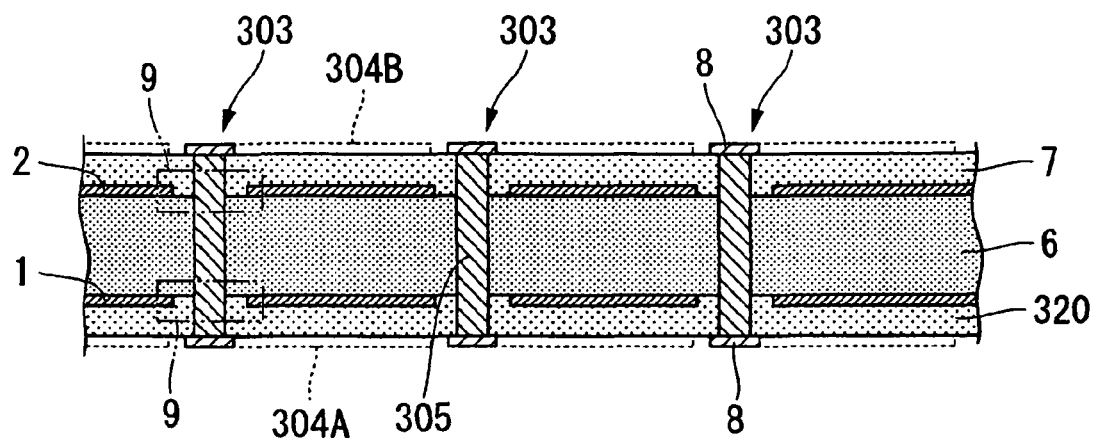
FIG. 13 is a cross-sectional view of an EBG structure used for explaining a waveguide structure according to a fourth embodiment of the present invention.

FIG. 13 is a cross-sectional view showing an EBG structure according to the fourth embodiment.

The EBG structure of the fourth embodiment is a variation of the EBG structure of the first embodiment, wherein parts identical to those used in the first embodiment are designated by the same reference numerals, thus avoiding duplicate descriptions thereof.

In contrast to the EBG structure of the first, second, and third embodiments in which the transmission lines 4, 104, 204A, and 204B are aligned in only the second conductive plane 2 within the first and second conductive planes 1 and 2 and are each configured to use the second conductive plane 2 as a return path, the fourth embodiment is characterized in that transmission lines 304A and 304B are arranged for the first and second conductive planes 1 and 2 respectively. That is, the EBG structure of the fourth embodiment is mirror-plane symmetrical to the EBG structure of the first embodiment in the vertical direction. As shown in FIG. 13, it is formed using a unit structure 303 including the first transmission line 304A which is laid in the layer different from the layers of the first and second conductive planes 1 and 2 and which uses the first conductive plane 1 as a return path, the second transmission line 304B which is laid in the layer different from the layers of the first and second conductive planes 1 and 2 and which uses the second conductive plane 2 as a return path, and a conductive via 305 for electrically connecting the prescribed ends of the transmission lines 304A and 304B together.

Specifically, the fourth embodiment is designed in such a manner similar to the first embodiment that the first conductive plane 1 is aligned on the lower surface of the first dielectric layer 6 in its thickness direction while the second conductive plane 2 is inserted between the first dielectric layer 6 and the second dielectric layer 7. A third dielectric layer (i.e. a backside dielectric layer 320) for covering the first conductive plane 1 is deposited on the lower surface of the first dielectric layer 6 in its thickness direction. In addition, the first transmission line 304A is aligned on the lower surface of the backside dielectric layer 320 in its thickness direction, while the second transmission line 304B is aligned on the surface of the second dielectric layer 7 in its thickness direction. That is, the first and second transmission lines 304A and 304B are positioned outside the region sandwiched between the first and second conductive planes 1 and 2.

Open ends are formed at one end of the first transmission line 304A (i.e. a right-side end in FIG. 13) and one end of the second transmission line 304B, so that the first and second transmission lines 304A and 304B serve as open stubs. The pads 8 which are formed in the same planes as the first and second transmission lines 304A and 304B are electrically connected to the other end of the first transmission line 304A (i.e. a left-side end in FIG. 13) and the other end of the second transmission line 304B. The pad 8 attached to the first transmission line 304A is electrically connected to the pad 8 attached to the second transmission line 304B via a conductive via 305 which is elongated in the thickness direction. The clearances 9 are formed at the positions corresponding to the opposite ends of the conductive via 305 in the first and second conductive planes 1 and 2, which are thus electrically isolated from each other and are not brought into contact with each other via the clearances 9.

Figure 14:
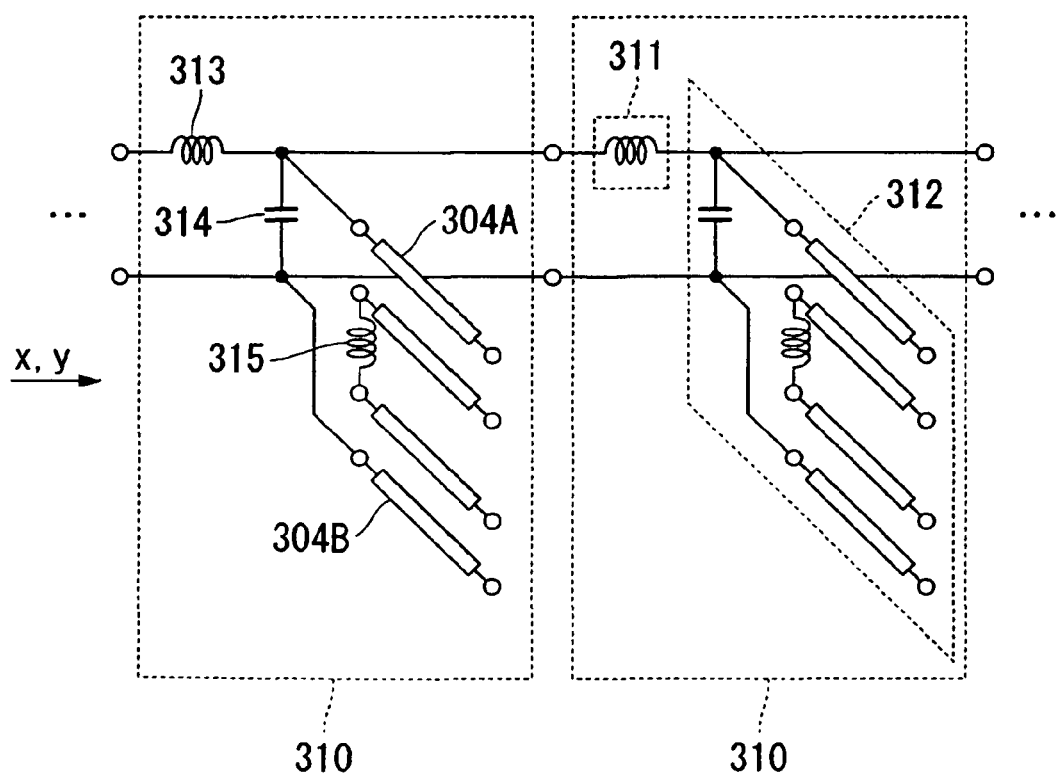
FIG. 14 is a circuit diagram showing an equivalent circuit of the EBG structure shown in FIG. 13.

FIG. 14 is a circuit diagram showing an equivalent circuit of the EBG structure of the fourth embodiment.

A repetitive unit 310 of the equivalent circuit shown in FIG. 14 is constituted of a serial impedance 311 and a parallel shunt 312. Similar to the first embodiment, the serial impedance 311 is composed of an inductance 13 formed between the first and second conductive planes 1 and 2. The parallel shunt 312 is constituted of a capacitance 314 formed between the first and second conductive planes 1 and 2, and an inductance 315 of the conductive via 305, as well as the first and second transmission lines 304A and 304B. The parallel shunt 312 used in the fourth embodiment is designed such that the open stub of the second transmission line 304B is additionally connected in series with the parallel shunt 12 used in the first embodiment. Similar to the first embodiment, the fourth embodiment is characterized in that band gaps occur in frequency bands in which the parallel shunt 312 becomes negative.

The EBG structure of the fourth embodiment is mirror-plane symmetrical to the EBG structure of the first embodiment in the vertical direction. Instead, it can be reconfigured in a manner mirror-plane symmetrical to the EBG structure of the second or third embodiment in the vertical direction.

Figure 15:
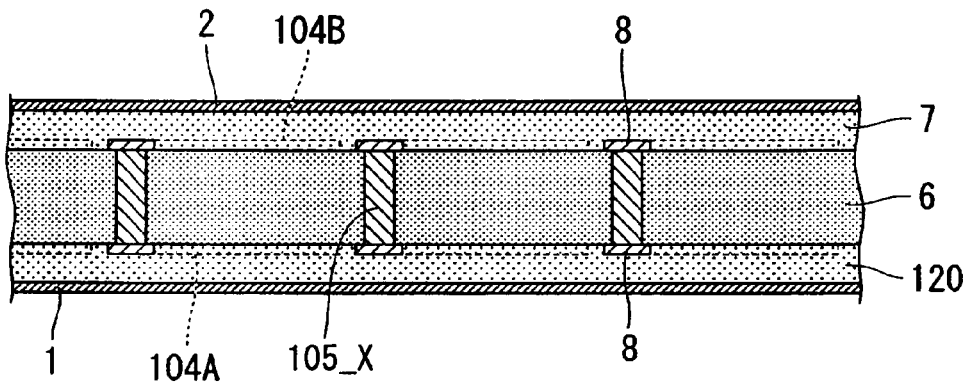
FIG. 15 is a cross-sectional view showing a first variation of the fourth embodiment which is created based on the EBG structure of the second embodiment.

Specifically, it is possible to create an EBG structure shown in FIG. 15 based on the EBG structure of the second embodiment, wherein a third dielectric layer 120 is inserted between the first conductive plane 1 and the first dielectric layer 6; a first transmission line 104A which uses the first conductive plane 1 as a return path is aligned between the first dielectric layer 6 and the third dielectric layer 120; and a second transmission line 104B which uses the second conductive plane 2 as a return path is aligned between the first dielectric layer 6 and the second dielectric layer 7. Open ends are formed at one end of the first transmission line 104A and one end of the second transmission line 104B, while the pads 8 are electrically connected to the other ends of the transmission lines 104A and 104B. The pads 8 attached to the first and second transmission lines 104A and 104B are electrically connected together via a conductive via 105_X of a non-through-via type.

Figure 16:
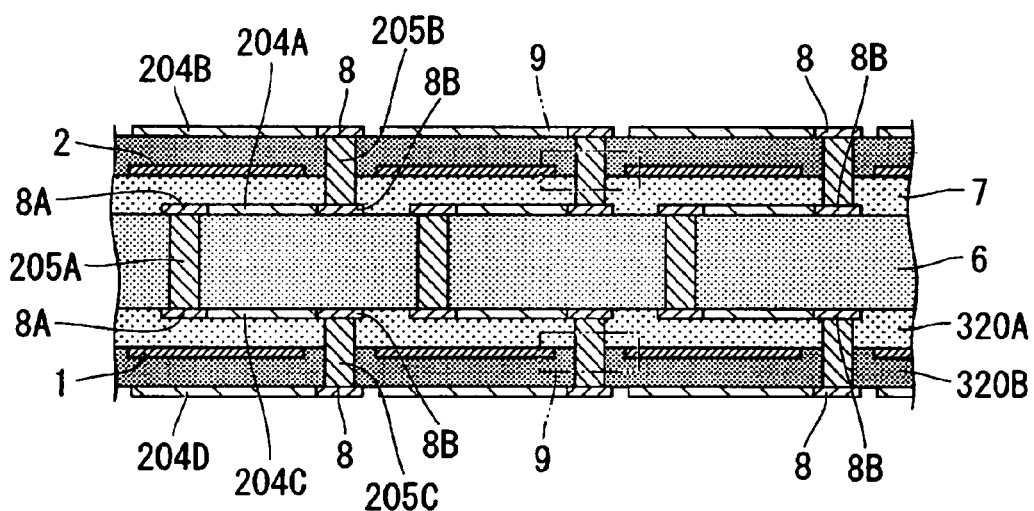
FIG. 16 is a cross-sectional view showing a second variation of the fourth embodiment which is created based on the EBG structure of the third embodiment.

It is possible to create an EBG structure shown in FIG. 16 based on the EBG structure of the third embodiment, wherein a third dielectric layer 320A is inserted between the first conductive plane 1 and the first dielectric layer 6, and a backside dielectric layer 320B for covering the first conductive plane 1 is deposited on the lower surface of the third dielectric layer 320A in its thickness direction. In addition, a third transmission line 204C which uses the first conductive plane 1 as a return path is laid between the first conductive plane 1 and the first transmission line 204A, in other words, between the first dielectric layer 6 and the third dielectric layer 320A. Furthermore, a fourth transmission line 204D which uses the first conductive plane 1 as a return path is positioned to face the first conductive plane 1 outside a region circumscribed between the first conductive plane 1 and the second conductive plane 2, in other words, it is aligned on the lower surface of the backside dielectric layer 320B in its thickness direction. The pads 8A and 8B which are formed in the same plane as the third transmission line 204C are electrically connected to the opposite ends of the third transmission line 204C. One end of the fourth transmission line 204D is an open end, and the pad 8 which is formed in the same plane as the fourth transmission line 204D is electrically connected to the other end of the fourth transmission line 204D.

The pad 8A attached to the first transmission line 204A is electrically connected to the pad 8A attached to the third transmission line 204C via the first conductive via 205A which is elongated in the thickness direction. The pad 8B attached to the third transmission line 204C is electrically connected to the pad 8 attached to the fourth transmission line 204D via a third conductive via 205C which is elongated in the thickness direction. The clearance 9 is formed at a prescribed position corresponding to the third conductive via 205C in the first conductive plane 1; hence, the first conductive plane 1 is electrically isolated from and is prevented from contacting the third conductive via 205C by means of the clearance 9.

All the EBG structures shown in FIGS. 13, 15, and 16 are designed in a mirror-plane symmetrical manner in the vertical direction; but this is not a restriction. It is possible to create an asymmetrical structure in which the first transmission line 304A has a linear shape while the second transmission line 304B has a spiral shape, for example. It is possible to make the second dielectric layer 7 differ from the backside dielectric layer 320 in thickness. In this case, it is noticed that the effective dielectric constant of the first transmission line 304A should differ from the effective dielectric constant of the second transmission line 304B.

5. Fifth Embodiment

Next, a waveguide structure according to a fifth embodiment of the present invention will be described with reference to FIGS. 17 and 18.

Figure 17:
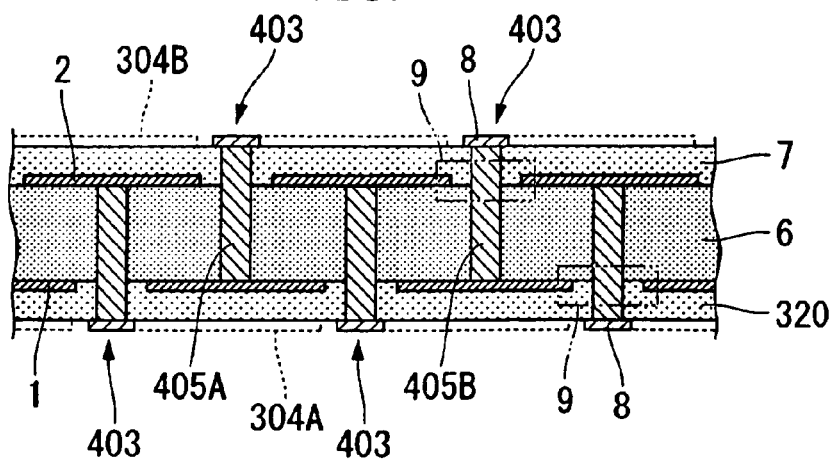
FIG. 17 is a cross-sectional view of an EBG structure used for explaining a waveguide structure according to a fifth embodiment of the present invention.

FIG. 17 is a cross-sectional view of an EBG structure according to the fifth embodiment. FIG. 18 is a plan view of the EBG structure, so that FIG. 17 is a cross-sectional view taken along line B-B in FIG. 17.

The EBG structure of the fifth embodiment is a variation of the EBG structure of the fourth embodiment, wherein parts identical to those of the fourth embodiment are designated by the same reference numerals, thus avoiding duplicate descriptions thereof.

In contrast to the EBG structure of the fourth embodiment shown in FIG. 13 in which the first transmission line 304A which uses the first conductive plane 1 as a return path is electrically connected to the second transmission line 304B which uses the second conductive plane 2 as a return path via the conductive via 305, the EBG structure of the fifth embodiment shown in FIG. 17 is designed such that the second transmission line 304B which uses the second conductive plane 2 as a return path is electrically connected to the first conductive plane 1 via a first conductive via 405A, while the first transmission line 304A which uses the first conductive plane 1 as a return path is electrically connected to the second conductive plane 2 as a second conductive via 405B. That is, the fifth embodiment is formed using a unit structure 403 including the first conductive via 405A for electrically connecting the first conductive plane 1 to the second transmission line 304B, and the second conductive via 405B for electrically connecting the second conductive plane 2 to the first transmission line 304A.

Specifically, the fifth embodiment is designed in such a manner similar to the fourth embodiment that the backside dielectric layer 320 is deposited on the lower surface of the first dielectric layer 6 in its thickness direction; the first conductive plane 1 is inserted between the first dielectric layer 6 and the backside dielectric layer 320; and the second conductive plane 2 is inserted between the first dielectric layer 6 and the second dielectric layer 7.

In addition, the first transmission line 304A is aligned on the lower surface of the backside dielectric layer 320 in its thickness direction, while the second transmission line 304B is aligned on the upper surface of the second dielectric layer 7 in its thickness direction.

The pads 8 are electrically connected to the left-side ends of the first and second transmission lines 304A and 304B. In a plan view, the pad 8 attached to the first transmission line 304A is shifted in position from the pad 8 attached to the second transmission line 304B. In addition, the pad 8 attached to the second transmission line 304B is electrically connected to the first conductive plane 1 via the first conductive via 405A, while the pad 8 attached to the first transmission line 304A is electrically connected to the second conductive plane 2. That is, a first shunt is formed by the first transmission line 304A, the pad 8, and the second conductive via 405B, while a second shunt is formed by the second transmission line 304B, the pad 8, and the first conductive via 405A. In a plan view of FIG. 18, the second shunt is formed at the position corresponding the first shunt subjected to parallel translation by A/2+B/2=(a/2,a/2) and further subjected to vertical inversion on the X-Y plane.

Figure 18:
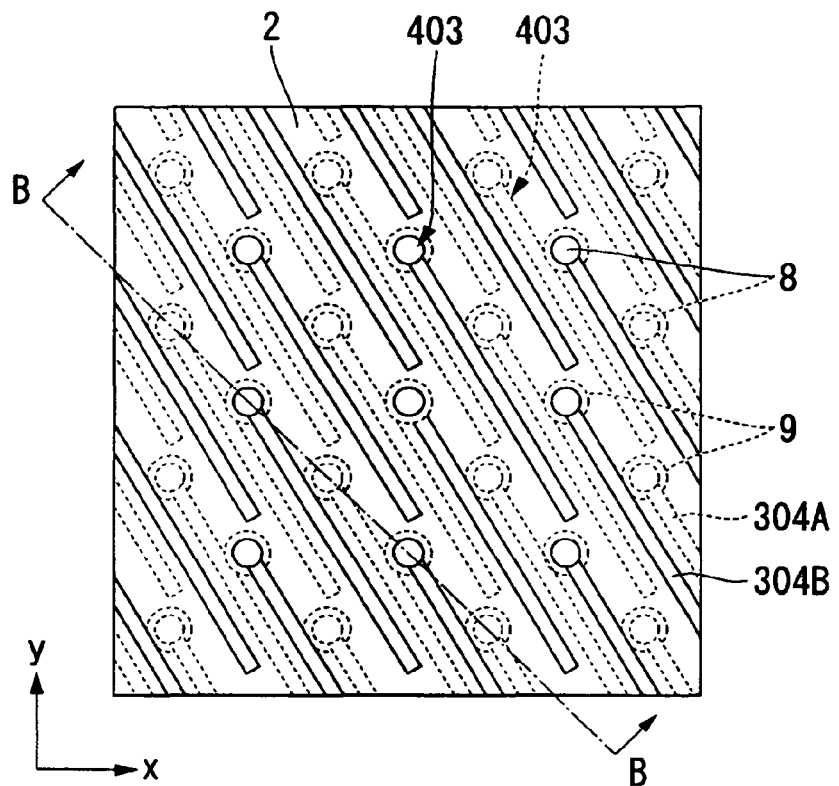
FIG. 18 is a plan view of the EBG structure shown in FIG. 17.

The EBG structure of the fifth embodiment makes it possible to locate the shunts with a high density in a plan view of FIG. 18; hence, it is possible to reduce the area of the EBG structure in packaging.

The EBG structure of the fifth embodiment is a variation of the EBG structure shown in FIG. 13, wherein it can be modified in a manner similar to the EBG structure shown in FIG. 15.

Figure 19:
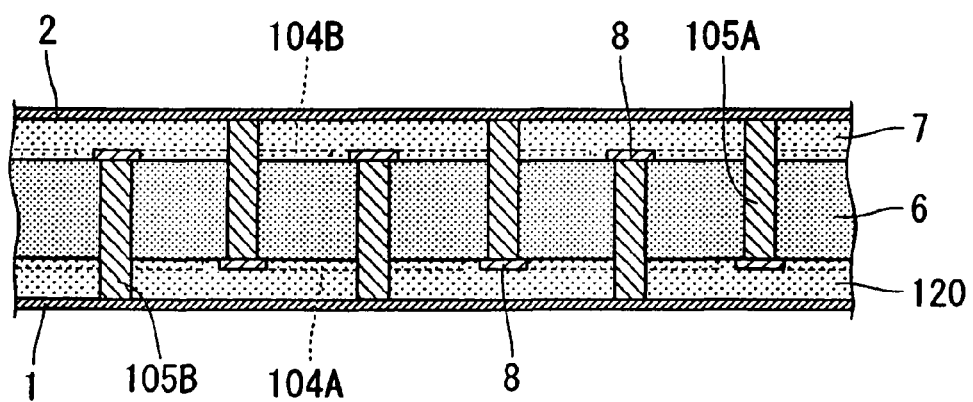
FIG. 19 is a cross-sectional view showing a variation of the fifth embodiment which is crated based on the EBG structure shown in FIG. 15.

Specifically, the EBG structure shown in FIG. 19 is created based on the EBG structure shown in FIG. 15, wherein the second transmission line 104B which uses the second conductive plane 2 as a return path is electrically connected to the first conductive plane 1 via a first conductive via 105A, and the first transmission line 104A which uses the first conductive plane 1 as a return path is electrically connected to the second conductive plane 2 via a second conductive via 105B.

In addition, it is possible to create an asymmetrical structure in which one of first and second transmission lines is aligned inside the region between the first and second conductive plane 1 and 2, and the other is aligned outside the region, wherein the second transmission line is electrically connected to the first conductive plane 1 via a first conductive via, and the first transmission line is electrically connected to the second conductive plane 2 via a second conductive via.

Figure 20:
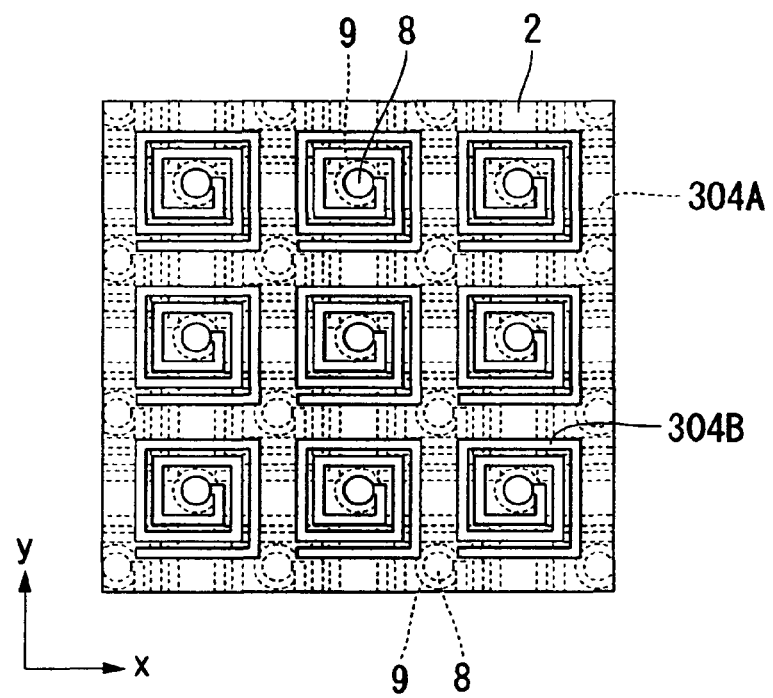
FIG. 20 is a plan view showing another variation of the fifth embodiment including spiral-shaped transmission lines.

FIG. 18 shows the fifth embodiment including the first and second transmission lines 304A and 304B both having linear shapes, which can be varied in various manners similar to the foregoing embodiments. For example, it is possible to employ spiral shapes as shown in FIG. 20.

Both the first and second transmission lines 304A and 304B are not necessarily formed in the same shape; hence, it is possible to create combinations in which one transmission line has a linear shape while another transmission line has a spiral shape, for example.

The fifth embodiment is not necessarily applied to the tetragonal lattice and is thus applicable to other types of lattices as well.

6. Sixth Embodiment

Next, a sixth embodiment of the present invention will be described with respect to a printed-circuit board with reference to FIGS. 21 and 22.

Figure 21:
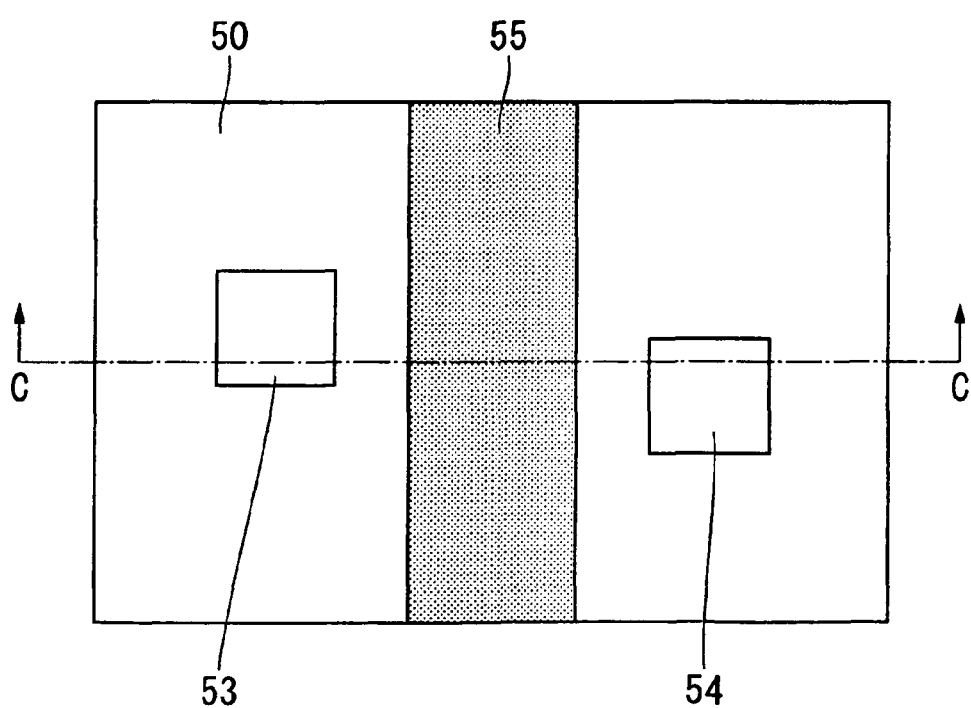
FIG. 21 is a plan view showing a printed-circuit board incorporating the EBG structure according to a sixth embodiment of the present invention.
Figure 22:
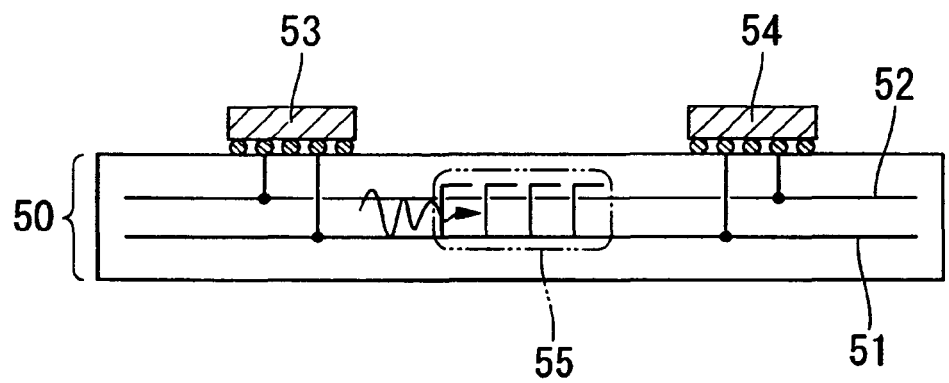
FIG. 22 is a cross-sectional view of the printed-circuit board shown in FIG. 21.

FIG. 21 is a plan view of the printed-circuit board according to the sixth embodiment, and FIG. 22 is a cross-sectional view taken along line C-C in FIG. 21.

The sixth embodiment is directed to a printed-circuit board 50 incorporating the aforementioned EBG structure. Specifically, the printed-circuit board 50 shown in FIGS. 21 and 22 includes a ground plane 51, a power-supply plane 52, a device 53 serving as a noise source, a device 54 sensitive to noise, and an EBG region 55 laid between the devices 53 and 54. As shown in FIG. 22, both the device 53 serving as the noise source and the device 54 sensitive to noise are connected to the ground plane 51 and the power-supply plane 52. The ground plane 51 and the power-supply plane 52 form a parallel-plate waveguide. In conventional printed-circuit boards, noises generated by noise-source devices propagate through parallel-plate waveguides so as to affect noise-sensitive devices, thus causing operational errors. The printed-circuit board 50 of the sixth embodiment shown in FIG. 21 is characterized in that the EBG region 55 corresponding to the aforementioned EBG structure is disposed to cut off a noise propagation path, thus suppressing propagation of noise between the devices 53 and 54. Thus, it is possible to reduce operational error occurring in the noise-sensitive device 54.

The printed-circuit board 50 of FIG. 22 employs the EBG structure of the first embodiment, which can be replaced with the EBG structures of the other embodiments.

Figure 23:
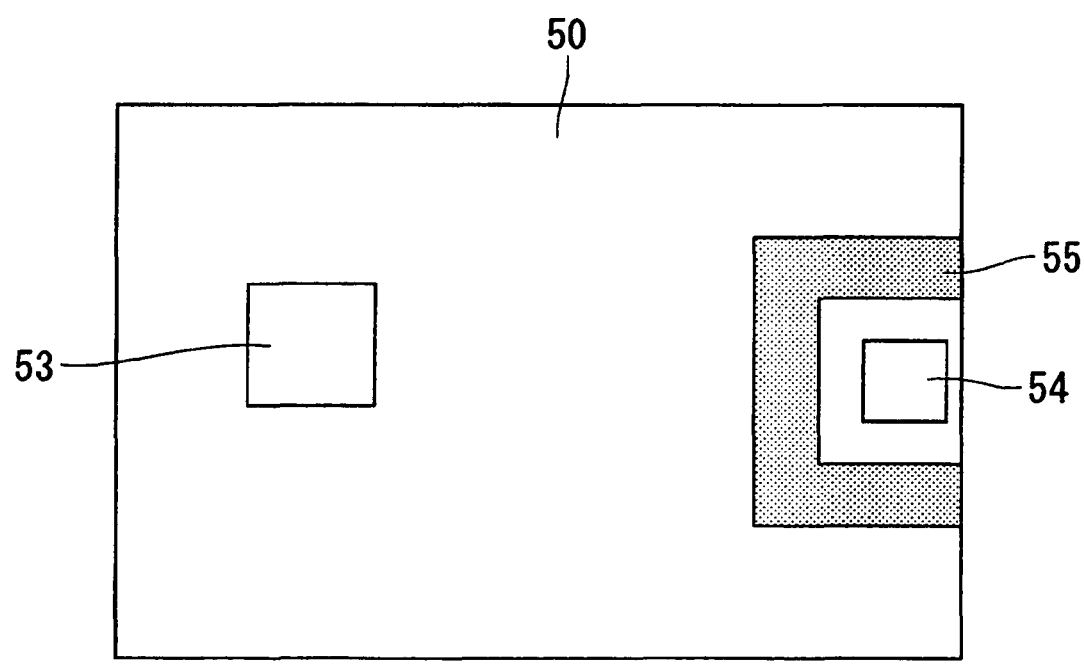
FIG. 23 is a plan view showing a variation of the sixth embodiment.

FIG. 21 shows that the EBG region 55 is arranged in a band shape; however, it is possible to employ any type of arrangements which can cut out the noise propagation path. It is possible to arrange the EBG structure surrounding the noise-sensitive device 54 as shown in FIG. 23.

The sixth embodiment is directed to the EBG structure installed in the printed-circuit board 50; but this is not a restriction. It is possible to install the aforementioned EBG structure in package substrates of devices or the like.

7. Seventh Embodiment

Next, a printed-circuit board according to a seventh embodiment of the present invention will be described with reference to FIG. 24.

Figure 24:
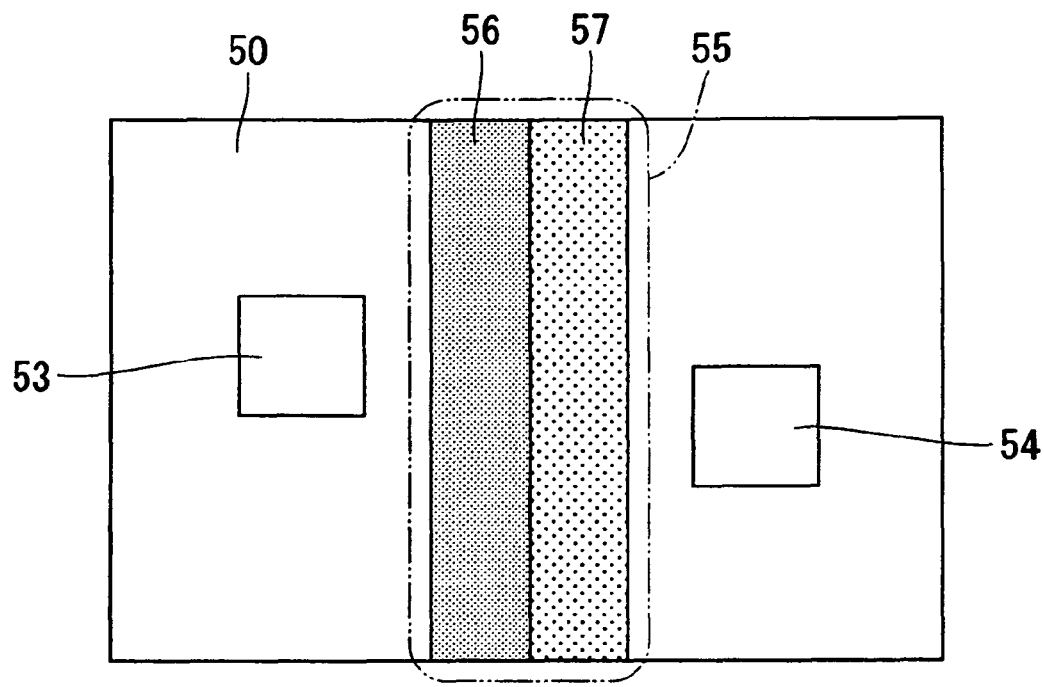
FIG. 24 is a plan view showing a printed-circuit board according to a seventh embodiment of the present invention.

FIG. 24 is a plan view of the printed-circuit board 50 according to the seventh embodiment, wherein parts identical to those of the sixth embodiment are designated by the same reference numerals, thus avoiding duplicate descriptions thereof.

The printed-circuit board 50 of the seventh embodiment includes a plurality of waveguide structures using open-end transmission lines having different lengths, wherein these waveguide structures are shifted in terms of band gaps.

Similar to the sixth embodiment, the printed-circuit board 50 of the seventh embodiment includes the ground plane 51, the power-supply plane 52, the device 53 serving as a noise source, and the noise-sensitive device 54. The seventh embodiment is characterized in that a first EBG structure 56 and a second EBG structure 57 are formed in the EBG region for cutting off the noise propagation path, thus suppressing propagation of noise between the devices 53 and 54. Herein, the first EBG structure 56 and the second EBG structure 57 are aligned in parallel in the noise propagation direction. The first EBG structure 56 and the second EBG structure 57 use respective open-stub transmission lines of different lengths so that they differ from each other in terms of frequency bands of band gaps. The lengths of transmission lines are set in such a way that band gaps cause by the first EBG structure 56 are deviated from band gaps caused by the second EBG structure 57; thus, it is possible to achieve "broad" band gaps, which cannot be obtained by a single EBG structure, by way of the EBG region 55.

Figure 25:
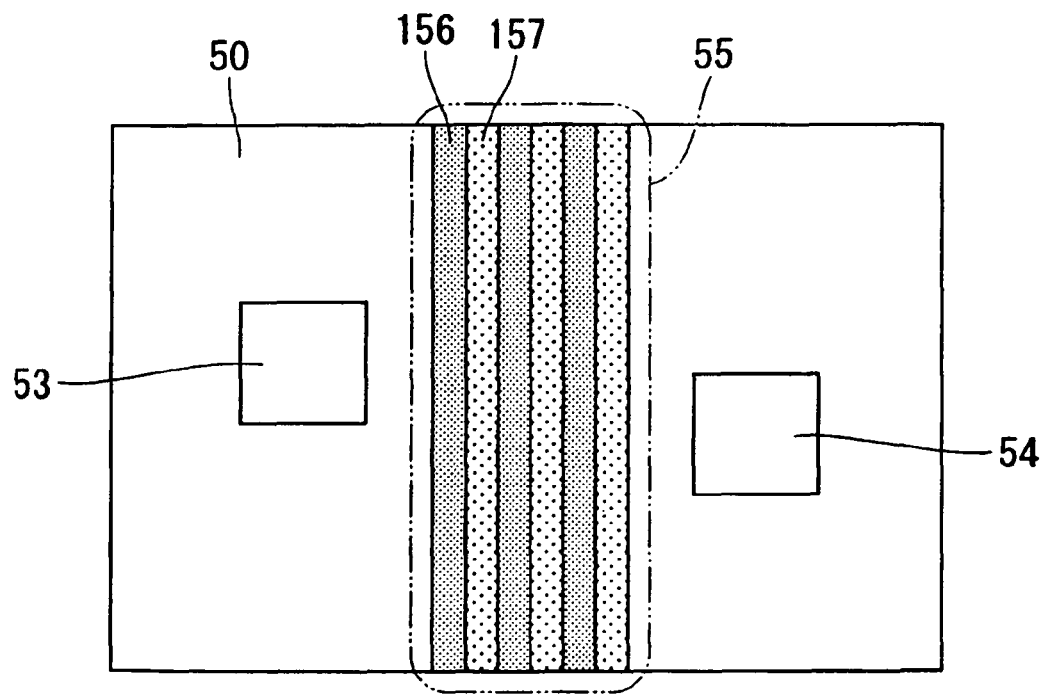
FIG. 25 is a plan view showing a first variation of the seventh embodiment in which two types of EBG structures are alternately aligned in the noise propagation direction.

FIG. 25 shows a first variation of the seventh embodiment in which first EBG structures 156 and second EBG structures 157 are alternately aligned in a stripe manner in the noise propagation direction.

Figure 26:
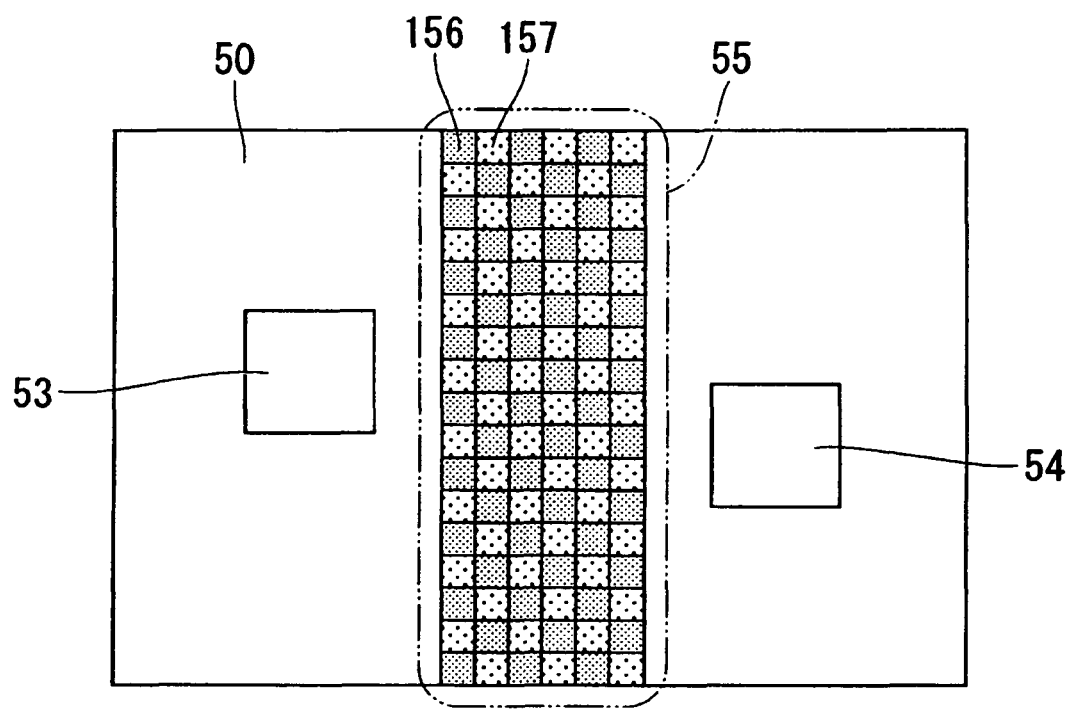
FIG. 26 is a plan view showing a second variation of the seventh embodiment in which two types of EBG structures are aligned in a checkered pattern.

FIG. 26 shows a second variation of the seventh embodiment in which the first EBG structures 156 and the second EBG structures 157 in a checkered pattern (or in checkers).

Both variations of the seventh embodiment achieve broad band gaps with the EBG region 55.

In this connection, it is possible to employ other types of arrangements in which the first and second EBG structures are intermixed together. Band gaps can be further enlarged by intermixing various types of EBG structures with deviated band gaps.

8. Eighth Embodiment

Next, an antenna according to an eighth embodiment of the present invention will be described.

Figure 29:
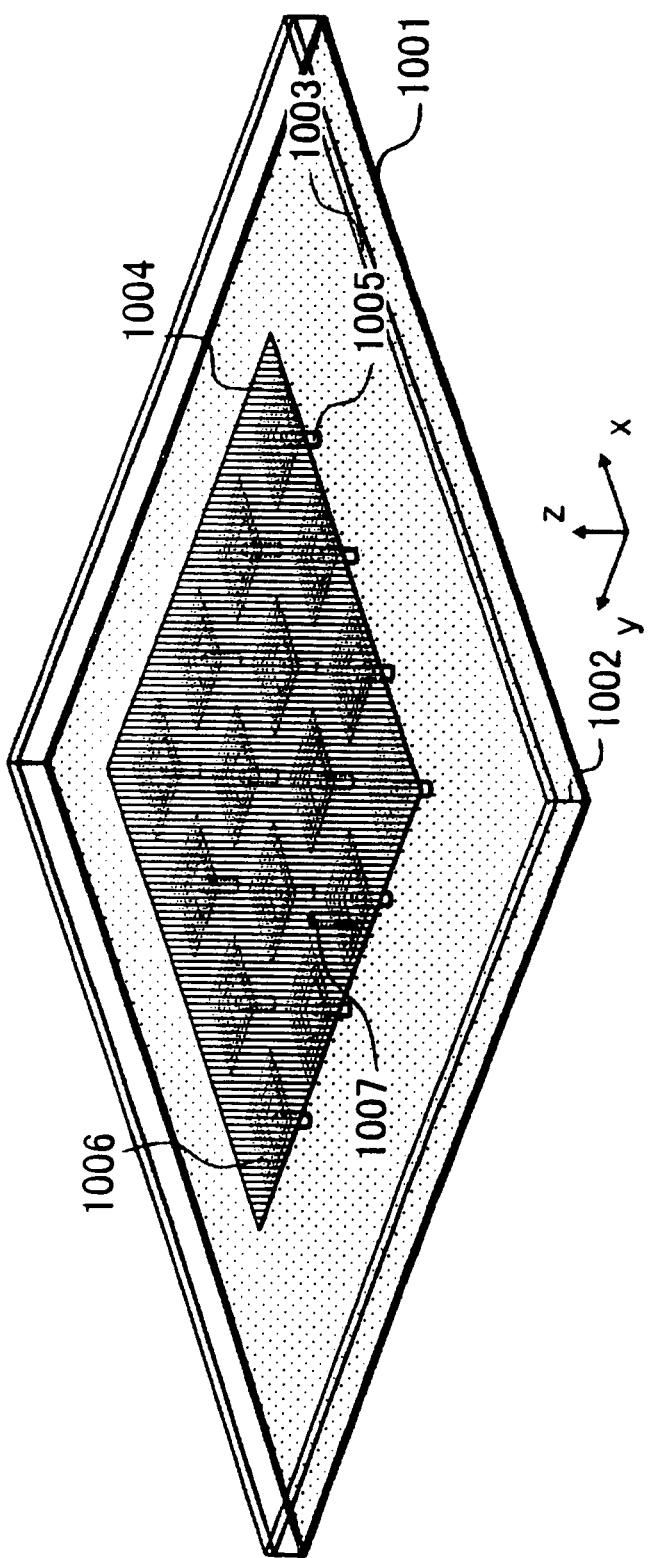
FIG. 29 is a perspective view showing an antenna according to an eighth embodiment of the present invention.
Figure 30:
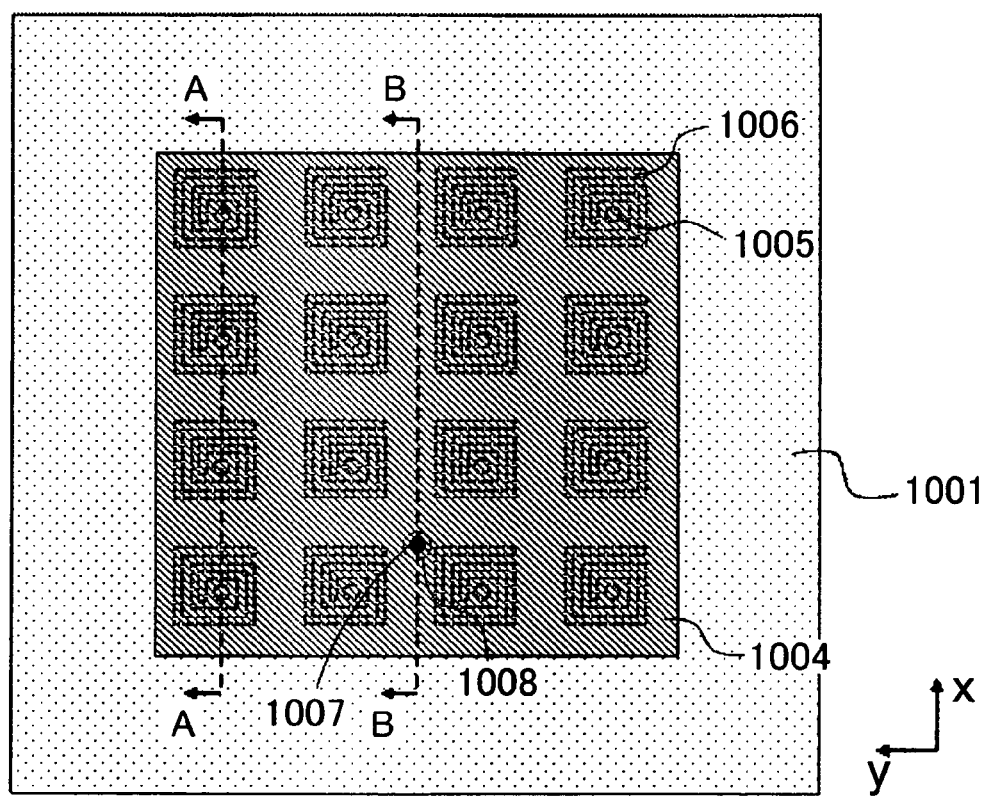
FIG. 30 is a plan view of the antenna viewed in a Z-axis direction.
Figure 31:
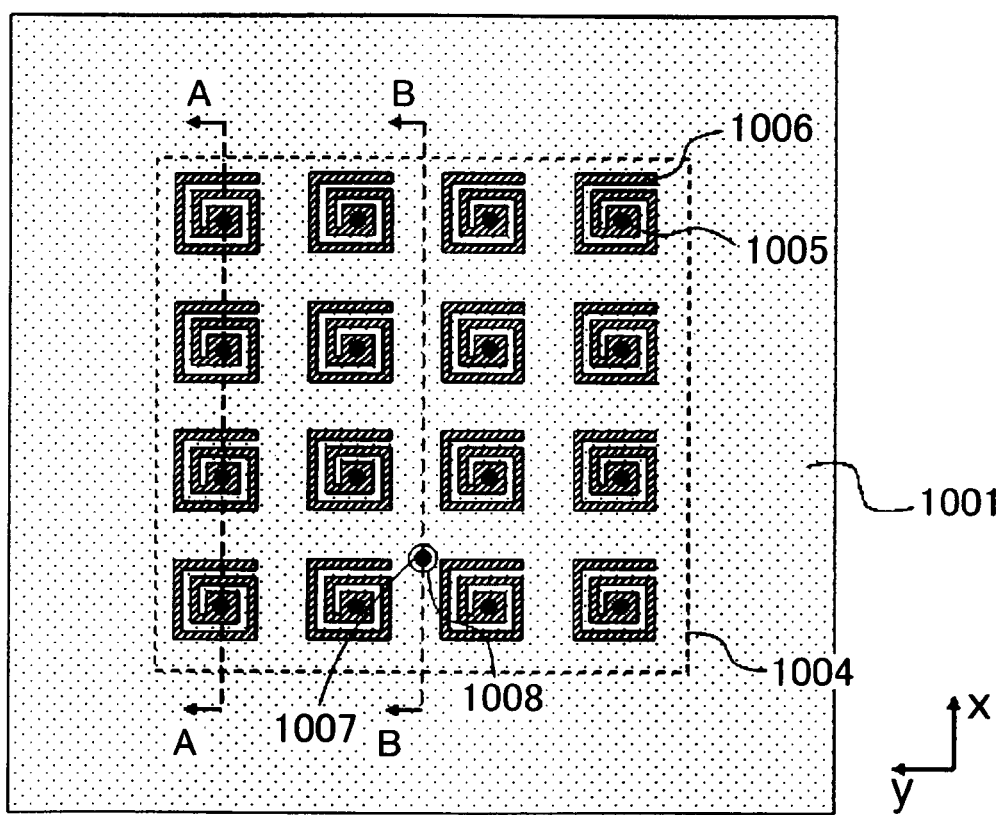
FIG. 31 a plan view of the antenna through a conductive patch viewed in the Z-axis direction.
Figure 32:
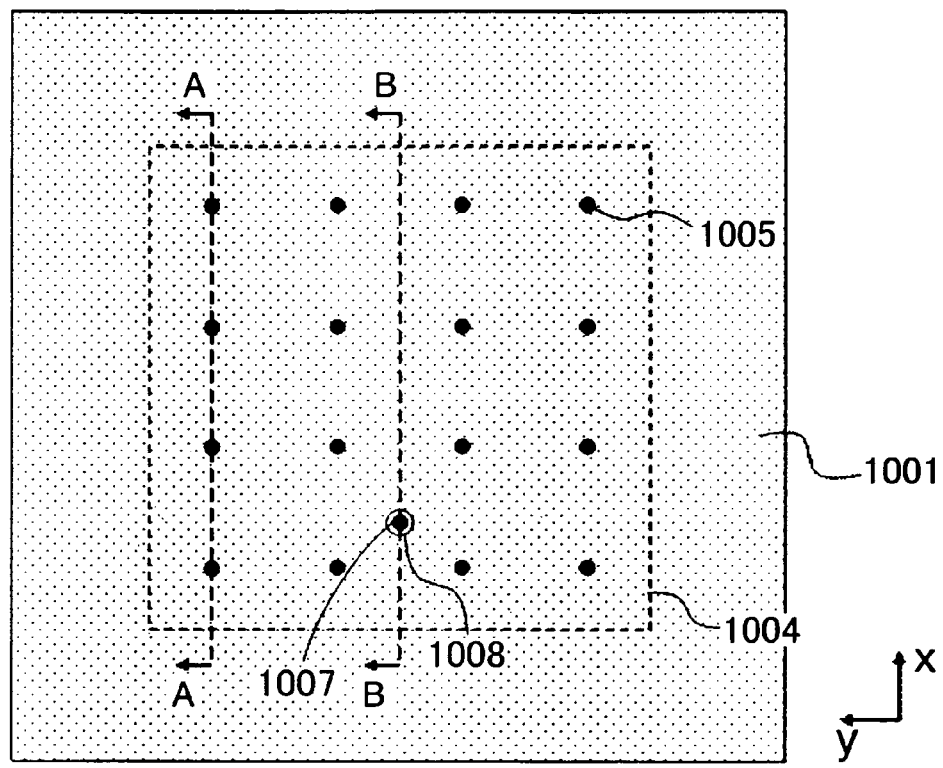
FIG. 32 is a plan view of a conductive plane included in the antenna.
Figure 33:
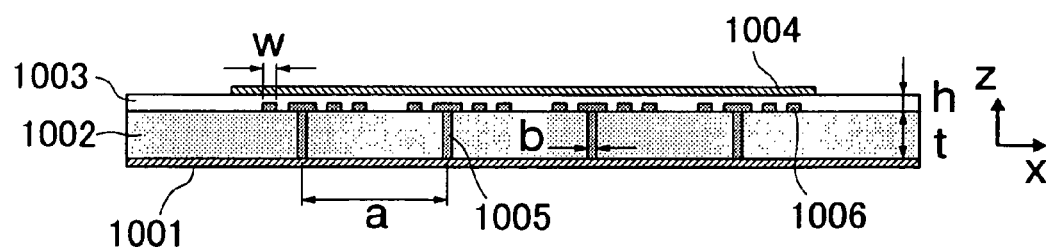
FIG. 33 is a cross-sectional view taken along line A-A in FIGS. 30 and 31.
Figure 34:
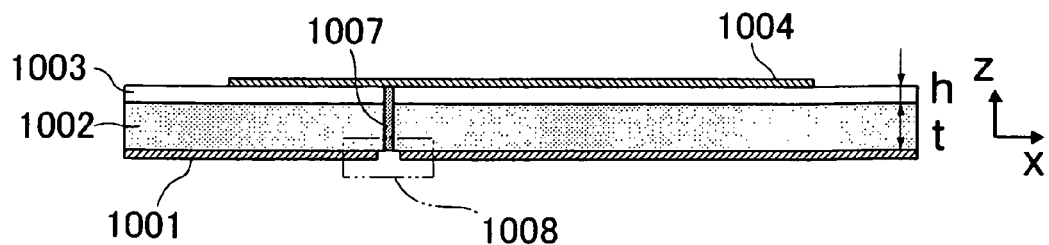
FIG. 34 is a cross-sectional view taken along line B-B in FIGS. 30 and 31.

FIG. 29 is a perspective view showing the antenna according to the eighth embodiment of the present invention. FIG. 30 is a plan view of the antenna viewed in an Z-axis direction. FIG. 31 a plan view of the antenna through a conductive patch viewed in the Z-axis direction. FIG. 32 is a plan view of a conductive plane included in the antenna. FIG. 33 is a cross-sectional view taken along line A-A in FIGS. 30 and 31. FIG. 34 is a cross-sectional view taken along line B-B in FIGS. 30 and 31.

As shown in FIG. 33, the antenna of the eight embodiment is constituted of a conductive plane (or a first conductive plane) 1001, a first dielectric layer 1002 disposed on the conductive plane 1001, a second dielectric layer 1003 disposed on the first dielectric layer 1002, and a conductive patch (or a second conductive plane) 1004 disposed on the second dielectric layer 1003. The conductive patch 1004 is positioned in parallel with the conductive plane 1001. As shown in FIG. 30, the conductive patch 1004 is smaller than the conductive plane 1001 such that the conductive patch 1004 is positioned to completely overlap with the conductive plane 1001 in plan view.

A transmission line 1006 which uses the conductive patch 1004 as a return path is aligned on a prescribed plane positioned to face the conductive patch 1004 in the layer sandwiched between the first dielectric layer 1002 and the second dielectric layer 1003. As shown in FIGS. 31 and 33, one end of the transmission line 1006 is electrically connected to the conductive plane 1001 via a conductive via 1005, while the other end of the transmission line 1006 is an open end, thus achieving the function of an open stub.

In the eight embodiment, the conductive via 1005 and the transmission line 1006 serve as a shunt. The antenna according to the present invention employs a structure including a plurality of shunts aligned in the conductive patch 1004. The eight embodiment refers to a basic structure in which a tetragonal lattice is aligned with a lattice spacing "a", wherein 4×4 shunts are aligned in the antenna of the eight embodiment shown in FIG. 29.

The antenna of the eighth embodiment serves as a patch antenna when electric excitation occurs between the conductive plane 1001 and the conductive patch 1004. As shown in FIGS. 32 and 34, a power-supply via 1007 is arranged as a power-supply unit securing signal transmission between the conductive plane 1001 and the conductive patch 1004. The power-supply via 1007 supplies high-frequency signals. One end of the power-supply via 1007 is connected to the conductive patch 1004, while the other end thereof is electrically insulated from the conductive plane 1001 by means of a power-supply clearance 1008 arranged for the conductive plane 1001. The other end of the power-supply via 1007 and the power-supply clearance 1008 form an input port for signals, wherein a signal input unit such as a coaxial cable is connected to the backside of the conductive plane 1001 so as to supply signals of a wireless communication circuit (not shown) to the antenna, for example. As the signal input unit other than the coaxial cable, it is possible to name a microstrip line or a strip line formed on the backside of the conductive plane.

Since the external periphery of the conductive patch 1004 has a high impedance, it is difficult to establish impedance matching with the power-supply system. Since the eighth embodiment can be freely designed in terms of the position of the power-supply via 1007 without interference with the shunt(s), it is possible to set the power-supply via 1007 to the position establishing impedance matching with the power-supply system for the conductive patch 1004. For the sake of convenience, FIGS. 20, 30, and 31 are illustrated in a perspective manner through the first dielectric layer 1002 and the second dielectric layer 1003.

Next, a basic principle for reducing the size of the antenna will be described.

Similar to conventional patch antennas, the antenna of the present invention serve as a resonator causing a half-wavelength resonation in the X-axis direction of the conductive patch. In general, the relationship between the wavelength and the frequency in a resonator depends upon the dispersion characteristics of media inside a resonator. The dispersion characteristics regarding a dielectric constant $\in$ and a relative permeability $\mu$ in a dielectric substance is given by equation (3), where "c" denotes speed of light in a vacuum state. Equation (3) shows that an angular frequency $\omega$ ($2\pi f$) is proportional to a wave number k ($=2\pi/\lambda$).

$$\omega = \frac{c}{\sqrt{\varepsilon\mu}} k \qquad (3)$$

The antenna of the present invention is designed to repetitively align shunts in the conductive patch so as to serve as a right-handed meta-material structure, thus effectively controlling the dispersion characteristics of the conductive patch.

Figure 35:
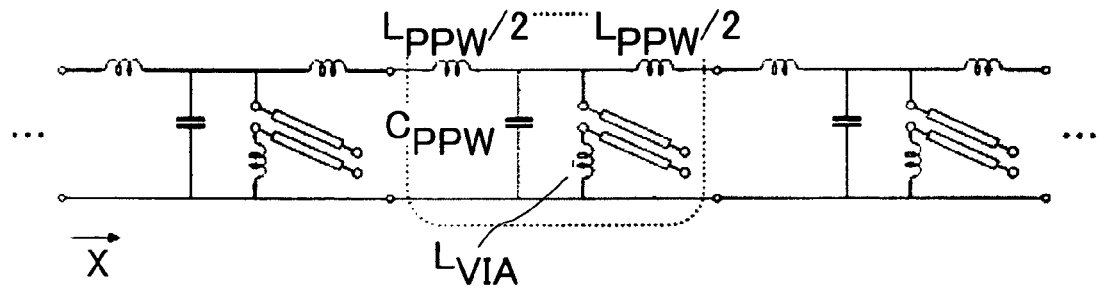
FIG. 35 is a circuit diagram showing an equivalent circuit of a meta-material structure applied to the antenna of FIG. 29.

FIG. 35 shows an equivalent circuit regarding propagation of electromagnetic waves in the space circumscribed by the conductive plane 1001 and the conductive patch 1004 of the antenna of FIG. 29 in the X-axis direction. A dotted-line region in FIG. 35 designates an equivalent circuit of a square-shaped unit structure with one-side length "a". In FIG. 35, $C_{PPW}$ and $L_{PPW}$ designate a capacitance and an inductance in a parallel-plate unit structure composed of the conductive plane 1001 and the conductive patch 1004. $L_{via}$ designates an inductance of the conductive via 1005. An open stub corresponds to the transmission line 1006.

According to the meta-material structure used in the antenna of the present invention, an admittance Y including $C_{PPW}$, $L_{via}$, and the open stub as defined in equation (4) serves as a right-handed media in a frequency range indicating the capacitive property (where Im(Y)>0), while it serves as a electromagnetic band gap in a frequency range indicating the inductive property (where Im(Y)<0). Herein, $Z_{in}$ denotes an input impedance of the open stub defined by equation (5). In equation (5), $Z_0$ denotes a characteristic impedance of the transmission line 1006 (i.e. the open stub in FIG. 35); d denotes the length of the transmission line 1006; and $\in_{eff}$ denotes an effective dielectric constant.

$$Y = \frac{1}{Z_{in} + i\omega L_{via}} + i\omega C_{PPW} \qquad (4)$$

$$Z_{in} = -\frac{iZ_0}{\tan\left(\frac{\omega\sqrt{\varepsilon_{eff}}}{c}d\right)} \qquad (5)$$

Figure 36:
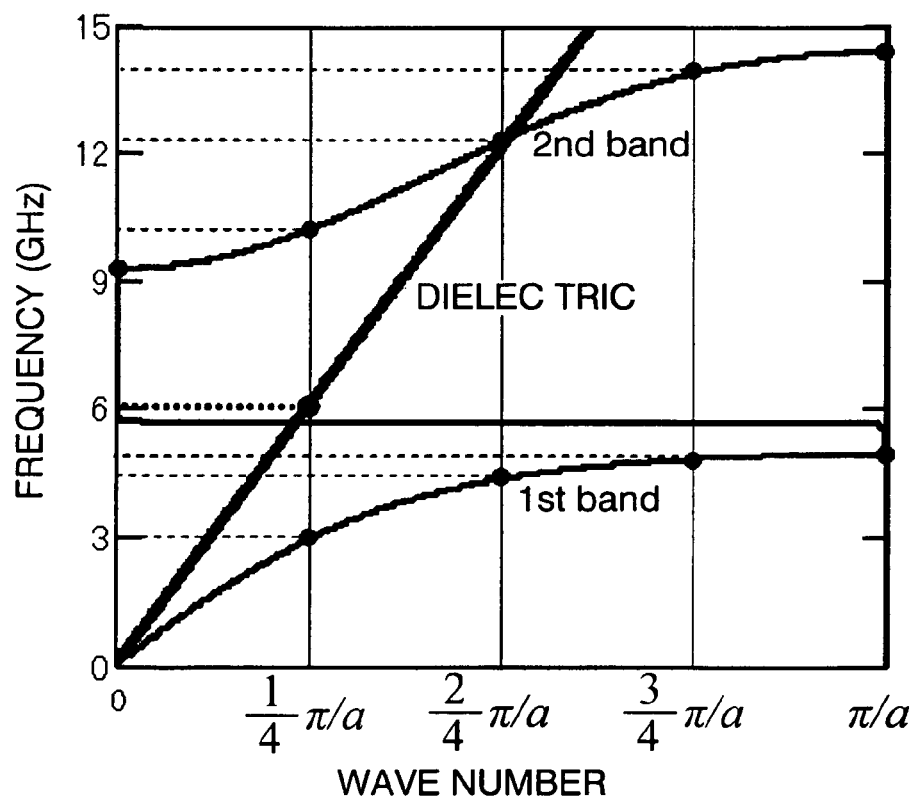
FIG. 36 is a graph showing dispersion characteristics of the meta-material structure.

The dispersion characteristics of a repetitive structure is produced by applying a repetitive boundary condition to the equivalent circuit of the unit structure shown in FIG. 35. FIG. 36 shows an example of the dispersion characteristics which is produced using prescribed dimensions of the antenna of FIG. 29 such as a=3 mm, t=800 μm, h=60 μm, w=100 μm, b=300 μm, and d=5.4 mm, as well as the dielectric constant of $\in$=4.188 and the relative permeability of μ=1 in the first dielectric layer 1002 and the second dielectric layer 1003. In FIG. 36, the horizontal axis represents the wave number, and the vertical axis represents the frequency. FIG. 36 clearly shows that the dispersion characteristics regarding the antenna of the present invention pass through the origin and does not have a cutoff in the low frequency range. It also shows that bands and band gaps alternately emerge in the order of a first band, a first band gap, a second band, and a second band gap in the low frequency range. This is because the capacitive property (where Im(Y)>0) and the inductive property (where Im(Y)<0) periodically changes over with respect to the admittance Y due to the impedance conversion effect of the open stub.

In general, the condition for causing a half-wavelength resonation in a resonator having a length L is given by equation (6) where "n" denotes an integral number.

$$k = \frac{n\pi}{L} \quad (6)$$

In an N×N alignment of shunts (where N denotes an integral number) in the antenna of the present invention, the length L of the conductive patch 1004 in the X-axis direction is given by L=N×a, which is substituted for equation (6) so as to produce a resonance condition of the antenna of the present invention defined in equation (7).

$$k = \frac{n\pi}{Na} \quad (\text{where } n = 0, 1, \ldots, N-1) \quad (7)$$

Vertical lines in the graph of FIG. 36 indicate wave numbers satisfying the resonance condition with respect to the antenna of FIG. 29 where N=4, and a=3 mm. Intersecting points between the vertical lines and the dispersion characteristics in FIG. 36 indicate half-wavelength resonance frequencies. FIG. 36 shows that resonance points corresponding to n=0, 1, 2, and 3 emerge in the first and second bands. Resonance antennas such as patch antennas are normally designed to use a first resonance. The antenna of the present invention may serve as a multi-band antenna, since it is varied in terms of the first resonance in connection with different bands.

A straight line passing through the origin in FIG. 36 indicates a "dielectric" dispersion characteristics regarding only a dielectric media having a dielectric constant of ∈=4.188. The resonance frequency of a conventional patch antenna corresponding to the antenna of FIG. 29 excluding shunts is given by intersecting points of the dielectric dispersion characteristics crossing the vertical lines in FIG. 36. FIG. 36 shows that the first resonance of the first band occurs around 3 GHz in the antenna of the present invention compared to the conventional patch antenna in which the first resonance occurs around 6 GHz. This indicates that the wavelength of electromagnetic waves is reduced to approximately a half of the wavelength during propagation in a dielectric substance by way of the meta-material structure of the antenna of the present invention. This proves that the size of the antenna of FIG. 29 is reduced to a half the size of the conventional patch antenna.

Since such a wavelength reduction effect of the meta-material structure occurs at all the resonance points below the straight line representing the dielectric dispersion characteristics in FIG. 36, it is possible to achieve a small-size antenna by use of the second and third resonances of the first band, or the third resonance of the second band, for example.

Figure 37:
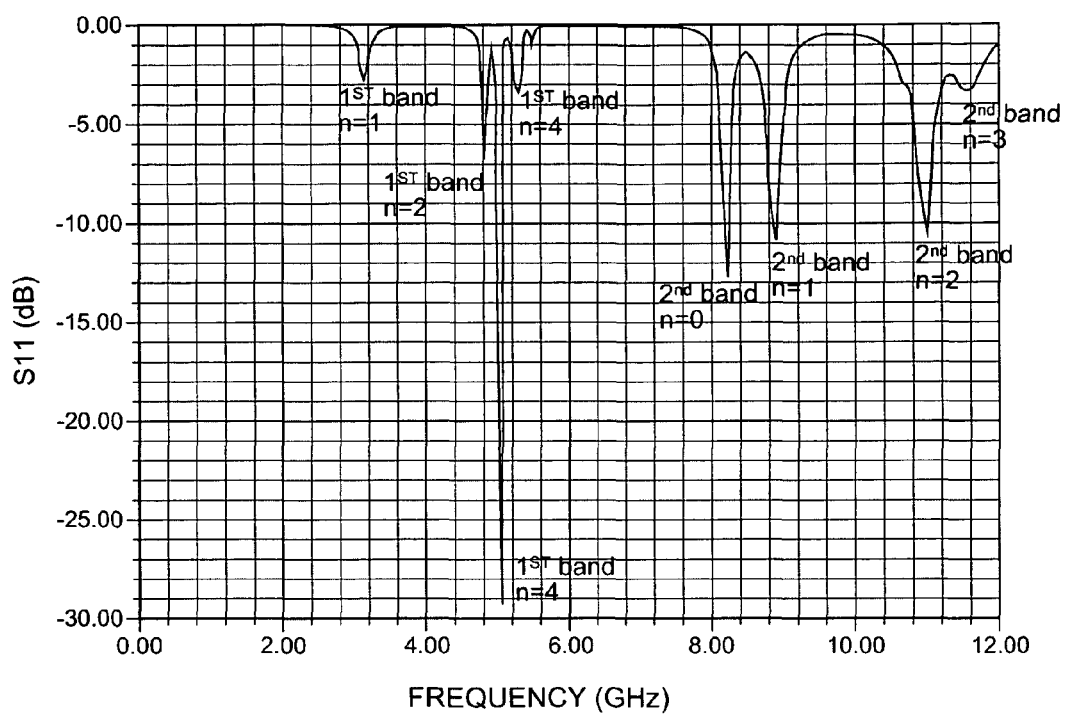
FIG. 37 is a graph showing the result of three-dimensional electromagnetic analysis regarding the S parameter with respect to the antenna of FIG. 29.

Since the wavelength becomes longer at the resonance points above the straight line of the dielectric dispersion characteristics rather than the propagation in the dielectric substance, it is possible to enhance an emission efficiency by enlarging the size of the antenna. FIG. 37 shows the result of three-dimensional electromagnetic analysis with respect to the antenna of FIG. 29. In FIG. 37, the horizontal axis represents the frequency, and the vertical axis represents the S parameter (S11) in view of the input port of the power-supply unit. FIG. 37 shows that dips occur at prescribed frequencies substantially suiting to the dispersion characteristics of FIG. 36, thus proving that the antenna operates at desired frequencies according to calculations.

Figure 38:
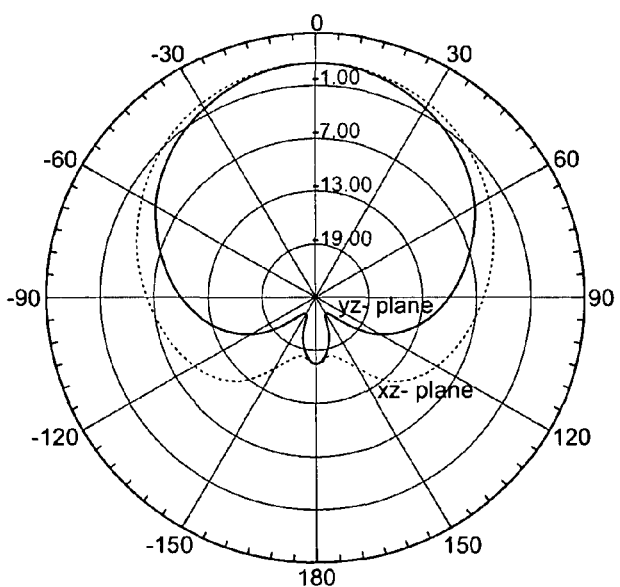
FIG. 38 is a circular graph showing the result of electromagnetic analysis regarding the emission directivity at the first resonance frequency of a first band with respect to the antenna of FIG. 29.
Figure 39:
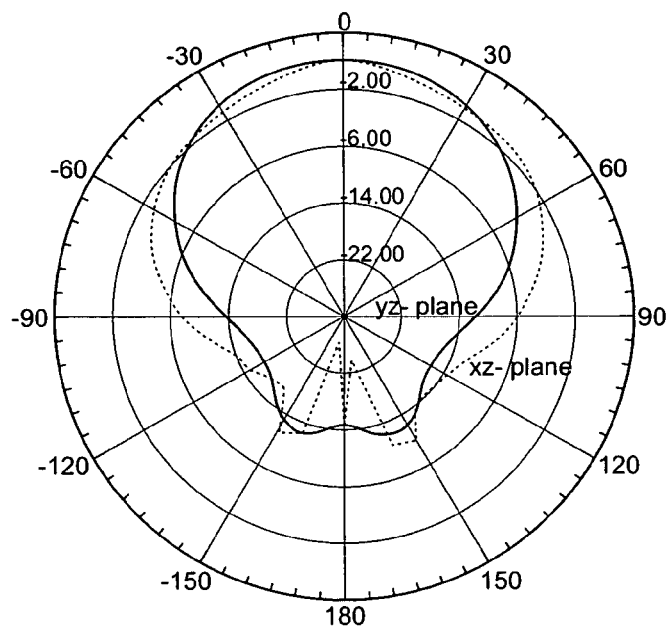
FIG. 39 is a circular graph showing the result of electromagnetic analysis regarding the emission directivity at the first resonance frequency of a second band with respect to the antenna of FIG. 29.

FIG. 38 shows the result of electromagnetic analysis regarding the emission directivity at 3.42 GHz which is the first resonance frequency of the first band, and FIG. 39 shows the result of electromagnetic analysis regarding the emission directivity at 8.86 GHz which is the first resonance frequency of the second band. In FIGS. 38 and 39, radius directions represent the gain of the antenna (dBi); dotted curves represent the emission directivity in the X-Z plane; and solid curves represent the emission directivity in the Y-Z plane. FIGS. 38 and 39 show that, similar to the conventional patch antenna, the antenna of the present invention demonstrate good emission characteristics in the Z-axis direction.

As the admittance Y of the meta-material structure applied to the antenna of the present invention is given by equations (4) and (5), it is possible to bring resonance frequencies into desired operating ranges by appropriately setting parameters in these equations. Due to a high degree of freedom of the transmission-line length d, it is possible to easily control the operating range of the antenna by changing the transmission-line length d.

The meta-material structure of the antenna of the present invention possesses right-handed dispersion curves in which all the bands are included in the positive direction. In particular, the first band possesses an ascending curve passing through the origin so that no cutoff exists in the low frequency range lower than the first band gap. In contrast to the left-handed meta-material structure of Patent Document 3 in which cutoffs should occur in the low frequency range, it is possible to easily lower the frequency range with respect to the antenna of the present invention.

FIG. 29 shows the 4×4 alignment of shunts, whereas the antenna of the present invention does not necessarily require an symmetrical alignment of shunts in the X-axis and Y-axis directions since it exploits the half-wavelength resonance in the X-axis direction. It is possible to employ a 4×2 alignment shown in FIG. 40 or a 4×1 alignment shown in FIG. 41, for example. These alignments offer "isotropic" dispersion of media in which unwanted resonance does not occur in the Y-axis direction, thus achieving a highly stabilized operation compared to the symmetrical alignment.

Figure 40:
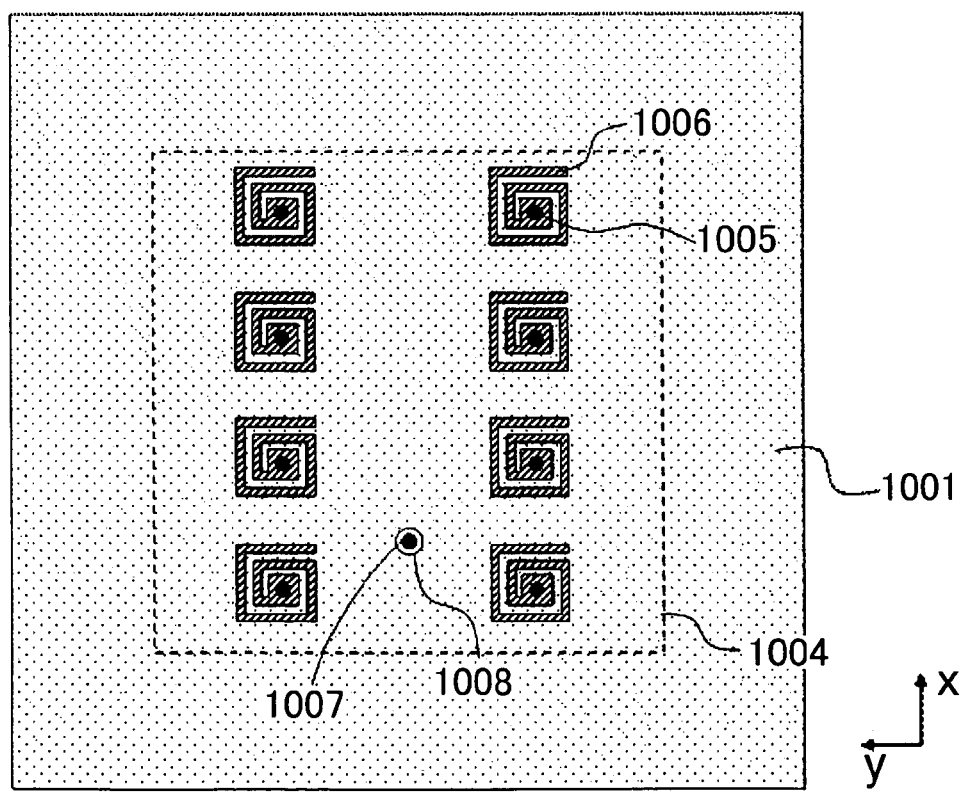
FIG. 40 is a plan view showing a 4×2 alignment of shunts in the conductive patch.
Figure 41:
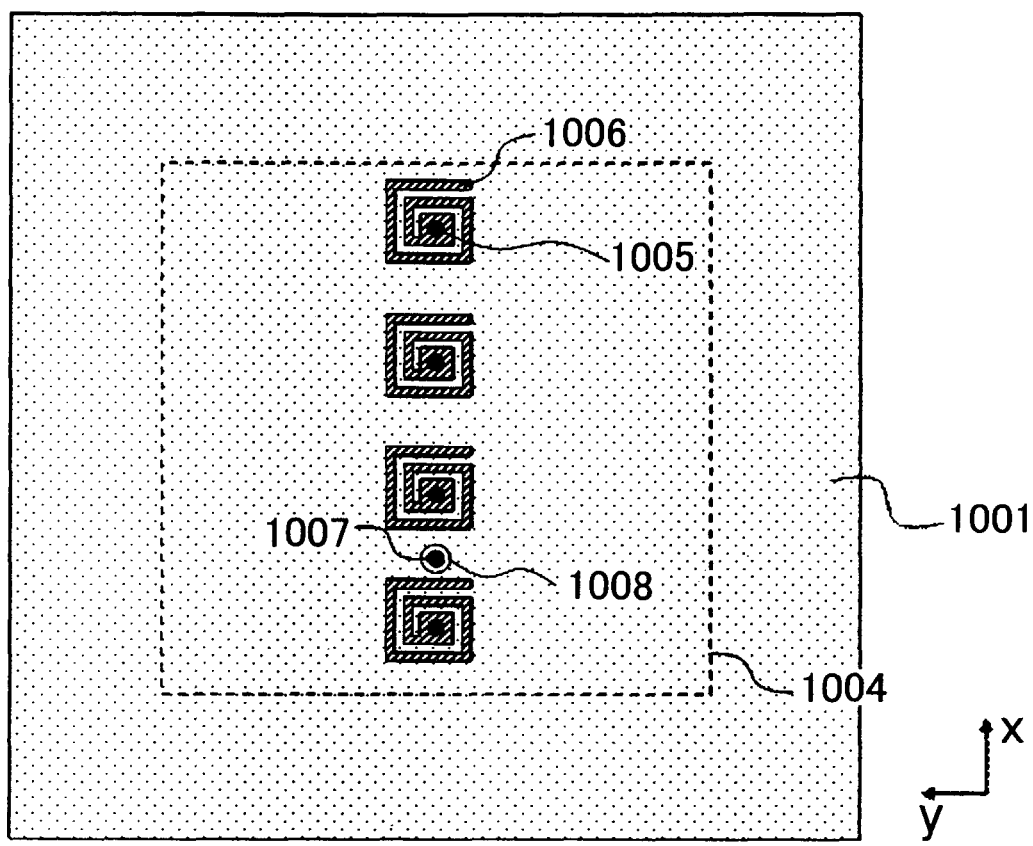
FIG. 41 is a plan view showing a 4×1 alignment of shunts in the conductive patch.
Figure 42:
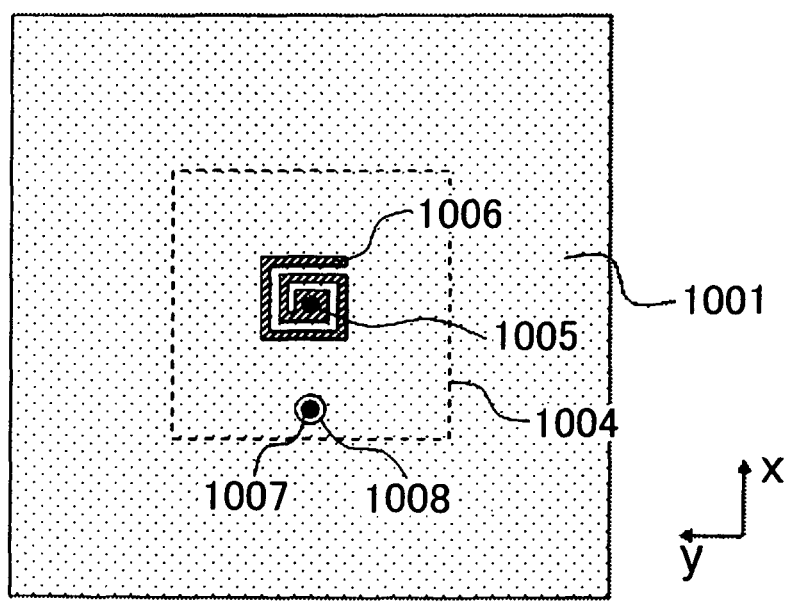
FIG. 42 is a plan view showing a single shut formed in the conductive patch.

It is possible to create a structure of FIG. 42 in which only one shunt is disposed in the conductive patch 1004. The conductive loss of the transmission line 1006 and the dielectric loss of the surrounding dielectric substance are not negligible elements in the antenna of the present invention. The aforementioned alignments shown in FIGS. 40, 41, and 42 are designed to reduce the number of shunts, thus reducing the conductive loss and dielectric loss. Thus, it is possible to improve an emission efficiency of the antenna.

Figure 43:
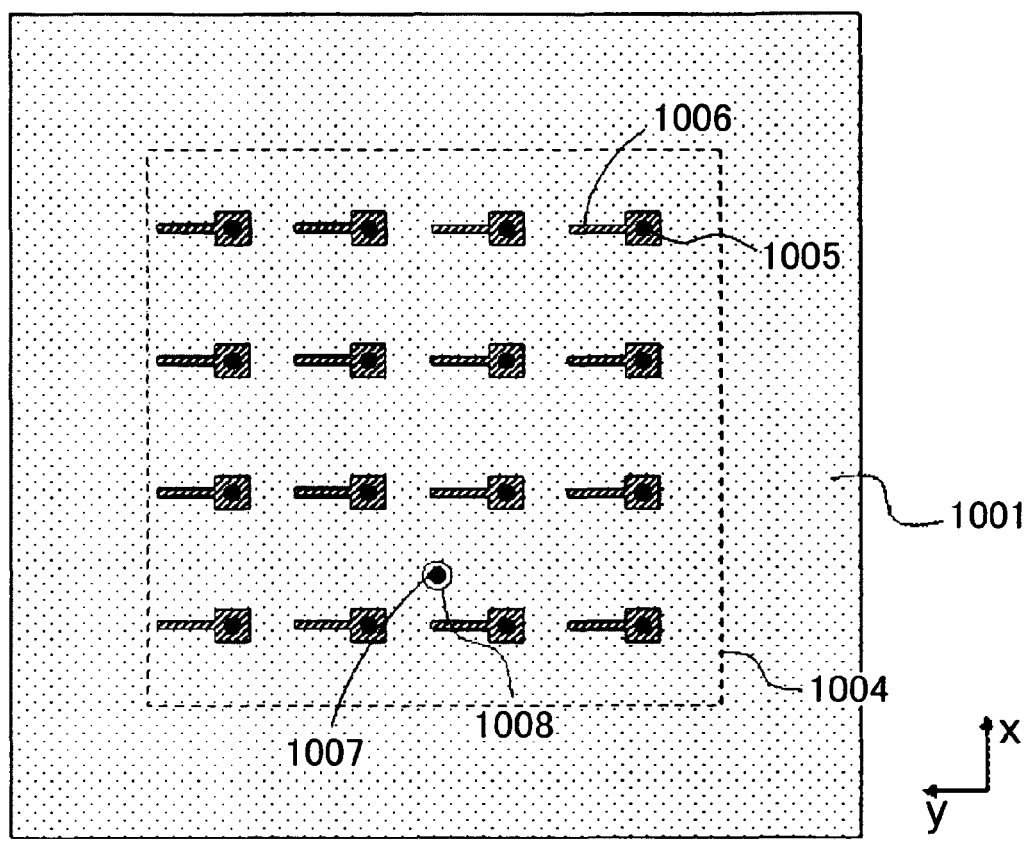
FIG. 43 is a plan view showing that linear-shaped transmission lines are aligned in the conductive patch.

Any shapes are applied to the transmission line 1006 without affecting the essential characteristics of the present invention as long as one end of the transmission line 1006 is connected to the conductive via 1005 while the other end thereof is an open end. FIG. 29 shows the spiral-shaped transmission line 1006, whereas it is possible to employ a linear shape for the transmission line 1006 as shown in FIG. 43. It is possible to employ other shapes such as a meandering shape with respect to the transmission line 1006.

The transmission lines 1006 are not necessarily formed in the same arrangement and shape in all the unit structures. For example, it is possible to arrange a spiral-shaped transmission line in one unit while arranging a linear transmission line in another unit.

Figure 44:
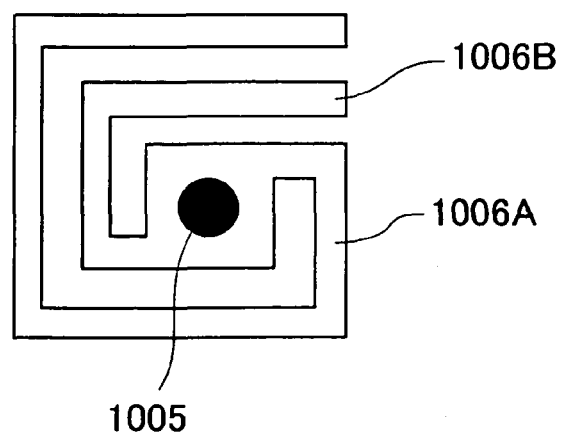
FIG. 44 is a fragmentary plan view showing a ramification of transmission lines.

It is possible to create a ramification in which the transmission line 1006 is branched away into transmission lines 1006A and 1006B having open ends. In the case of a single transmission line whose length is determined so as to set the first band or the first band gap to a desired frequency band, the frequency bands of the second band and its following bands should be automatically determined based on equations (4) and (5). In the case of FIG. 44, the transmission lines 1006A and 1006B have different impedance conversion periods so as to set the first and second bands independently, thus achieving a high degree of freedom in setting frequency bands.

In this connection, the branching point between the transmission lines 1006A and 1006B is not necessarily disposed in proximity to the conductive via 1005; hence, it is possible to create the structure in which the transmission line 1006B is branched away from an intermediate portion of the transmission line 1006B.

Figure 45:
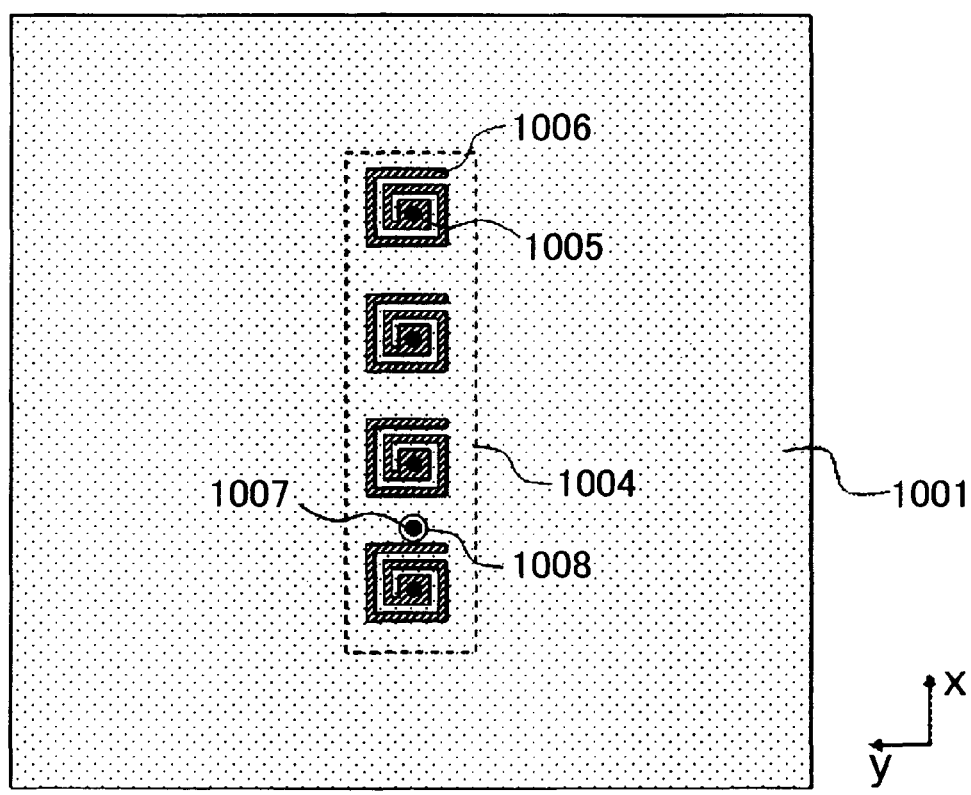
FIG. 45 is a plan view showing a rectangular-shaped conductive patch.

Although the eighth embodiment shows the square-shaped conductive patch 1004, any shapes are applied to the conductive patch 1004 without affecting the essential characteristics of the present invention. It is possible to create the structure of FIG. 45 in which the conductive patch 1004 is formed in a rectangular shape, for example.

Figure 46:
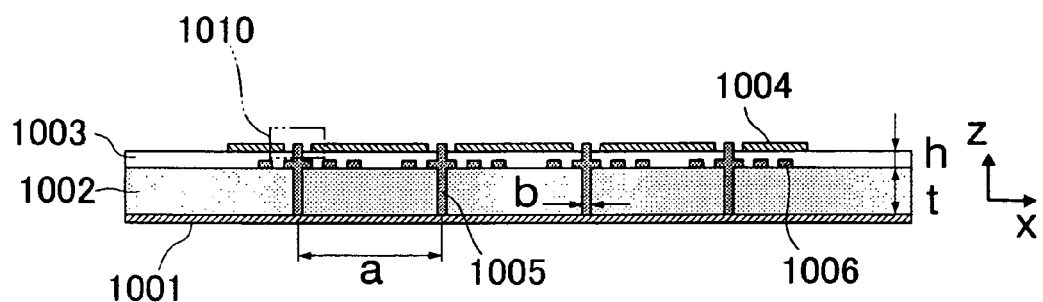
FIG. 46 is a cross-sectional view showing that the conductive via shown in FIG. 33 is replaced with a through via.

FIG. 33 shows that the conductive via 1005 is a non-through-type via; but this is not a restriction as long as the transmission line 1006 is electrically connected to the conductive plane 1001. For example, it is possible to employ the structure of FIG. 46 using a through via as the conductive via 1005 without affecting the essential characteristics of the present invention. For the purpose of electric insulation secured between the conductive patch 1004 and the through-via-type conductive via 1005, it is necessary to form a clearance 1010 at the position of the conductive via 1005 in the conductive patch 1004. Employing the through via makes it possible to collectively process the conductive vias 1005 by use of drills after the lamination of a substrate, thus reducing the manufacturing cost.

9. Ninth Embodiment

Figure 47:
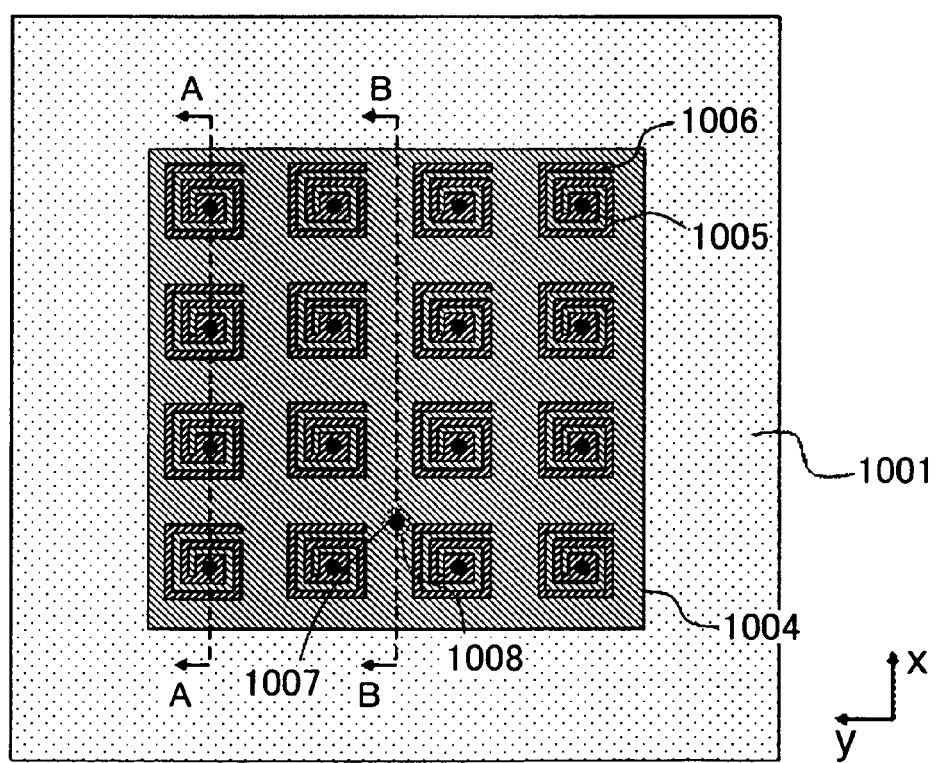
FIG. 47 is a plan view showing an antenna according to a ninth embodiment of the present invention viewed in the Z-axis direction.
Figure 48:
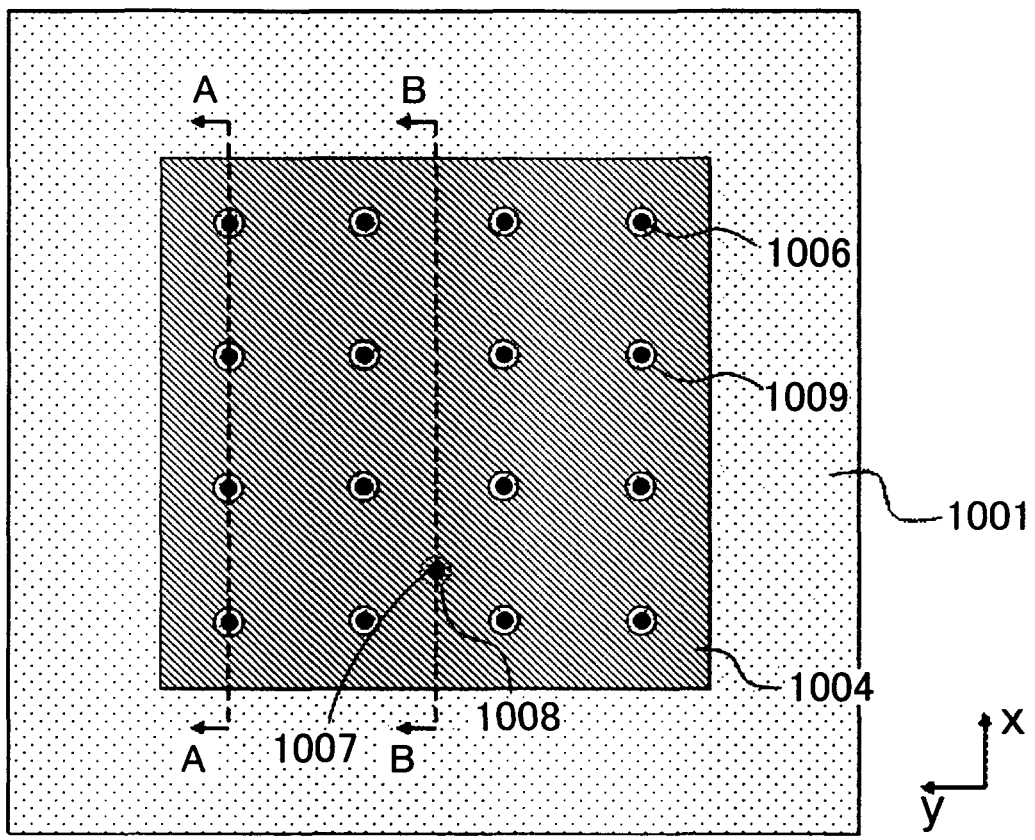
FIG. 48 is a plan view of the antenna excluding transmission lines viewed in the Z-axis direction.
Figure 49:
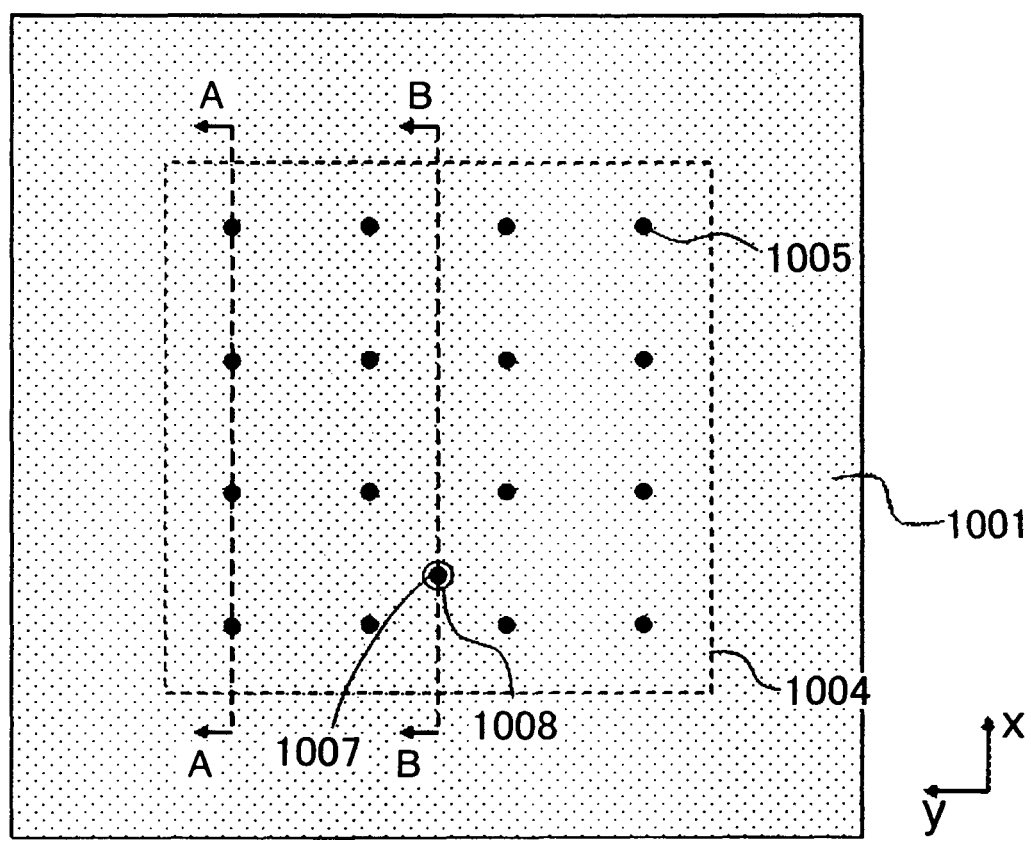
FIG. 49 is a plan view of a conductive plane included in the antenna of FIG. 47.
Figure 50:
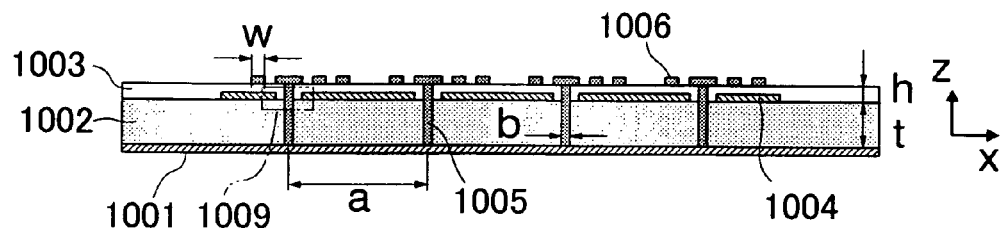
FIG. 50 is a cross-sectional view taken along line A-A in FIGS. 47 to 49.
Figure 51:
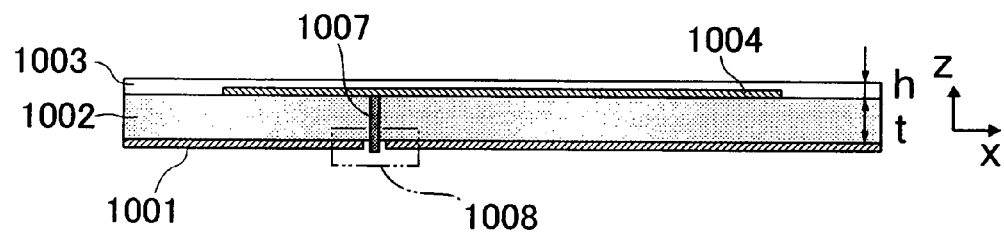
FIG. 51 is a cross-sectional view taken along line B-B in FIGS. 47 to 49.

Next, a ninth embodiment of the present invention will be described with reference to FIGS. 47 to 51, wherein parts identical to those of the eighth embodiment are designated by the same reference numerals. FIG. 47 is a plan view showing an antenna according to the ninth embodiment viewed in the Z-axis direction. FIG. 48 is a plan view of the antenna excluding the transmission lines 1006 viewed in the Z-axis direction. FIG. 49 is a plan view of the conductive plane 1001. FIG. 50 is a cross-sectional view taken along line A-A in FIGS. 47 to 49. FIG. 51 is a cross-sectional view taken along line B-B in FIGS. 47 to 49.

The antenna of the ninth embodiment is created by partially changing the layered structure of the antenna of the eight embodiment.

As shown in FIG. 50, the antenna of the ninth embodiment is constituted of the conductive plane 1001, the first dielectric layer 1002 deposited on the conductive plane 1001, and the second dielectric layer 1003 deposited on the first dielectric layer 1002, wherein the conductive patch 1004 composed of a metal is disposed in a layer sandwiched between the first dielectric layer 1002 and the second dielectric layer 1003. In addition, the transmission line 1006 which uses the conductive patch 1004 as a return path is aligned on the second dielectric layer 1003 in a plane so as to face the conductive patch 1004. As shown in FIGS. 47 and 50, one end of the transmission line 1006 is electrically connected to the conductive plane 1001 via the conductive via 1005, while the other end thereof is an open end, thus achieving the function of an open stub. As shown in FIGS. 48 and 50, the clearance 1009 is formed at the position of the conductive via 1005 in the conductive patch 1004, which is electrically insulated from the conductive via 1005. In the ninth embodiment, the conductive via 1005, the transmission line 1006, and the clearance 1009 serve as a shunt. The ninth embodiment is similar to the eighth embodiment in terms of the arrangement of the shunt and the shape of the transmission line 1006. The ninth embodiment is equipped with the power-supply via 1007 as a power-supply unit. As shown in FIGS. 49 and 51, one end of the power-supply via 1007 is connected to the conductive patch 1004, while the other end thereof is electrically insulated from the conductive plane 1001 by means of the power-supply clearance 1008 formed in the conductive plane 1001. The power-supply via 1007 and the power-supply clearance 1008 serve as an input port of signals.

The operating principle of the ninth embodiment is identical to that of the eighth embodiment. The dielectric loss of a dielectric substance surrounding the transmission line 1006 is not a negligible element in the antenna of the present invention, wherein the ninth embodiment is designed to further reduce the dielectric loss in comparison with the eight embodiment because the transmission line 1006 is surrounded by air. Thus, it is possible to improve the emission efficiency of the antenna.

10. Tenth Embodiment

Figure 52:
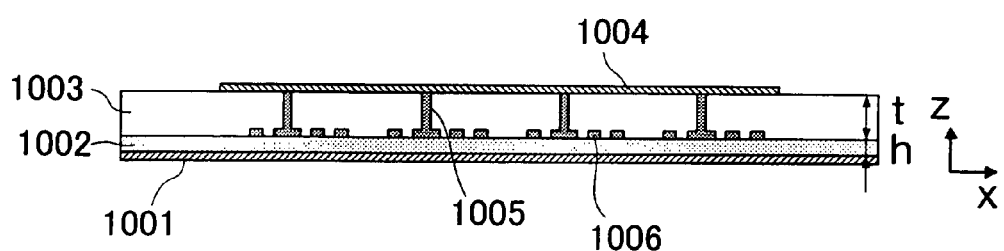
FIG. 52 is a cross-sectional view showing an antenna according to a tenth embodiment of the present invention in the X-Z plane.

Next, a tenth embodiment of the present invention will be described. FIG. 52 is a cross-sectional view showing an antenna according to the tenth embodiment of the present invention viewed in a X-Z plane including the conductive via 1005.

As shown in FIG. 52, the tenth embodiment is designed to partially modify the eight embodiment in such a way that one end of the transmission line 1006 is connected to the conductive patch 1004 by means of the conductive via 1005. In the tenth embodiment, the transmission line 1006 is aligned in a plane to face the conductive plane 1001 so as to serve as an open stub which uses the conductive plane 1001 as a return path. The equivalent circuit of the tenth embodiment is identical to the equivalent circuit shown in FIG. 35; hence, the operating principle of the tenth embodiment is identical to that of the eighth embodiment. In addition, the tenth embodiment is identical to the eighth embodiment in terms of the layered structure, the arrangement of the shunt, the shape of the transmission line 1006, and the structure of the power-supply unit. FIG. 52 shows that the conductive via 1005 is a non-through-type via, whereas similar to the eighth embodiment, it is possible to use a through via.

11. Eleventh Embodiment

Figure 53:
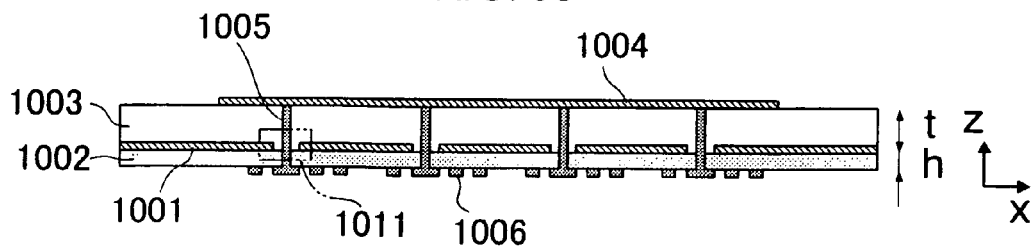
FIG. 53 is a cross-sectional view showing an antenna according to an eleventh embodiment of the present invention in the X-Z plane.

Next, an eleventh embodiment of the present invention will be described. FIG. 53 is a cross-sectional view showing an antenna according to the eleventh embodiment in the X-Z plane including the conductive via 1005.

As shown in FIG. 53, the antenna of the eleventh embodiment is constituted of the conductive plane 1001, the first dielectric layer 1002 deposited under the conductive plane 1001, and the second dielectric layer 1003 deposited on the conductive plane 1001. The transmission line 1006 which uses the conductive plane 1001 as a return path is aligned under the first dielectric layer 1002 in a plane to face the conductive plane 1001. In addition, the conductive patch 1004 composed of a metal is disposed on the second dielectric layer 1003. One end of the transmission line 1006 is electrically connected to the conductive patch 1004 by means of the conductive via 1005, while the other end thereof is an open end, thus serving as an open stub. A clearance 1011 is formed at the position of the conductive via 1005 in the conductive plane 1001, which is electrically insulated from the conductive via 1005. In the eleventh embodiment, the conductive via 1005, the transmission line 1006, and the clearance 1011 serve as a shunt. The eleventh embodiment is identical to the eight embodiment in terms of the arrangement of the shunt, the shape of the transmission line 1006, and the structure of the power-supply unit.

The operating principle of the eleventh embodiment is identical to that of the eighth embodiment. The dielectric loss of a dielectric substance surrounding the transmission line 1006 is not a negligible element in the antenna of the present embodiment, wherein the eleventh embodiment is designed to further reduce the dielectric loss in comparison with the eighth embodiment because the transmission line 1006 is surrounded by air. Thus, it is possible to improve the emission efficiency of the antenna.

12. Twelfth Embodiment

Figure 54:
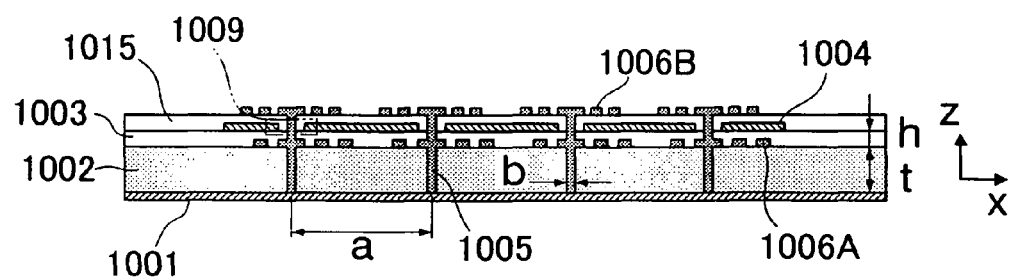
FIG. 54 is a cross-sectional view showing an antenna according to a twelfth embodiment of the present invention in the X-Z plane.

Next, a twelfth embodiment of the present invention will be described. FIG. 54 is a cross-sectional view showing an antenna according to the twelfth embodiment of the present invention in the X-Z plane including the conductive via 1005.

As shown in FIG. 54, the antenna of the twelfth embodiment is constituted of the conductive plane 1001 as well as the first dielectric layer 1002, the second dielectric layer 1003, and a third dielectric layer 1015 which are sequentially deposited on the conductive plane 1001. The conductive patch 1004 composed of a metal is disposed in the layer sandwiched between the second dielectric layer 1003 and the third dielectric layer 1015. In addition, a first transmission line 1006A which uses the conductive patch 1004 as a return path is deposited in the layer sandwiched between the first dielectric layer 1002 and the second dielectric layer 1003 in the plane to face the conducive patch 1004. Furthermore, a second transmission line 1006B which uses the conductive patch 1004 as a return path and whose length differs from the length of the first transmission line 1006A is disposed on the third dielectric layer 1015. First ends of the transmission lines 1006A and 1006B are electrically connected to the conductive plane 1001 by means of the conductive via 1005, while second ends thereof are open ends, thus serving as open stubs. As shown in FIG. 54, the clearance 1009 is formed at the position of the conductive via 1005 in the conductive patch 1004, which is electrically insulated from the conductive via 1005. In the twelfth embodiment, the conductive via 1005, the transmission lines 1006A and 1006B, and the clearance 1009 serve as a shunt.

The twelfth embodiment is identical to the eighth embodiment in terms of the arrangement of the shunt, the shape of the transmission line, and the structure of the power-supply unit.

The operating principle of the twelfth embodiment is identical to that of the eighth embodiment.

In the case of a single transmission line whose length is determined so as to set the first band or the first band gap to a desired frequency range, the second band and its following bands should be automatically determined based on equations (4) and (5). In contrast, it is possible to set the first and second bands independently in the twelfth embodiment due to different impedance conversion periods applied to the transmission lines 1006A and 1006B, thus securing a high degree of freedom in setting frequency bands.

13. Thirteenth Embodiment

Figure 55:
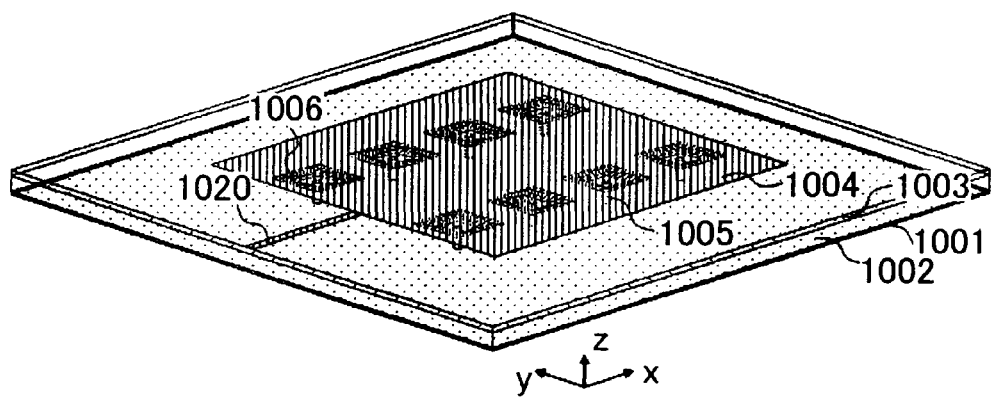
FIG. 55 is a perspective view showing an antenna according to a thirteenth embodiment of the present invention.
Figure 56:
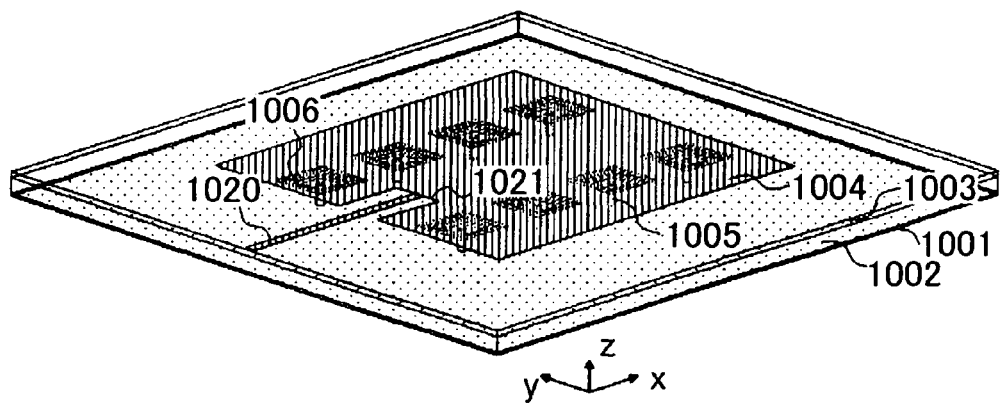
FIG. 56 is a perspective view showing an antenna according to a variation of the thirteen embodiment.

Next, a thirteenth embodiment of the present invention will be described. FIGS. 55 and 56 are perspective views showing an antenna according to the thirteenth embodiment of the present invention. The antenna of the eighth embodiment is designed such that the power-supply via 1007 serves as the power-supply unit for the conductive patch 1004, and an input port of signals is formed by use of the power-supply via 1007 and the power-supply clearance 1008 disposed in the conductive plane 1001. As the power-supply method applied to this structure, it is possible to name the method for directly connecting a coaxial cable to the backside of the conductive plane 1001 and the method in which a microstrip line or a strip line serving as a power-supply line is formed on the backside of the conductive plane 1001 and is connected to the backside of the conductive plane 1001. The method using the coaxial cable suffers from an enlargement of size and is not suited to the purpose of the present invention for reducing the size of an antenna. The method using the power-supply line formed on the backside of the conductive plane 1001 should increase the number of layers, which in turn leads to the complexity of the overall structure.

As shown in FIG. 55, the thirteenth embodiment is designed to partially modify the eighth embodiment in such a way that the power-supply unit is formed using a microstrip line 1020 formed in the same plane as the conductive patch 1004. The microstrip line 1020 is connected to the external periphery of the conductive patch 1004 so as to receive signals from a wireless communication circuit (not shown) by means of the antenna. It is difficult to establish impedance matching between the power-supply unit and the external periphery of the conductive patch having high impedance. As shown in FIG. 56, a rectangular cutout 1021, which may be similarly used in the conventional patch antenna, is formed in the conductive patch 1004 so as to locate the microstrip line 1020 in the external periphery of the conductive patch 1004 subjected to impedance matching with the power-supply unit. That is, the thirteenth embodiment is designed to reduce the size of the antenna and to secure a power-supply operation with a simple structure.

14. Fourteenth Embodiment

Figure 57:
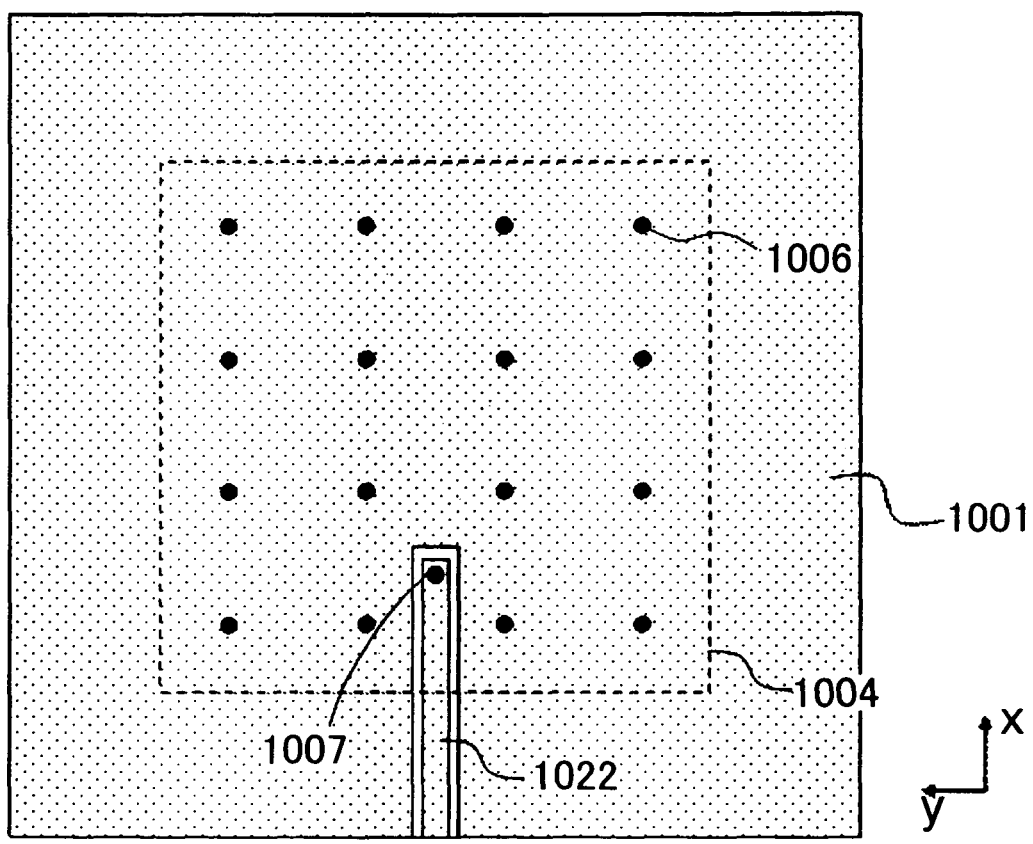
FIG. 57 is a plan view showing an antenna according to a fourteenth embodiment of the present invention.

Next, a fourteenth embodiment of the present invention will be described. FIG. 57 is a plan view of the conductive plane 1001 included in an antenna according to the fourteenth embodiment of the present invention. The fourteenth embodiment is designed to partially modify the eighth embodiment in such a way that the power-supply unit is formed using a coplanar line 1022 formed in connection with the conductive plane 1001 and the power-supply via 1007. The coplanar line 1022 is connected to the power-supply via 1007 so as to receive signals from a wireless communication circuit (not shown) by means of the antenna. The fourteenth embodiment is designed to reduce the size of the antenna and to secure a power-supply operation with a simple structure.

15. Fifteenth Embodiment

Figure 58:
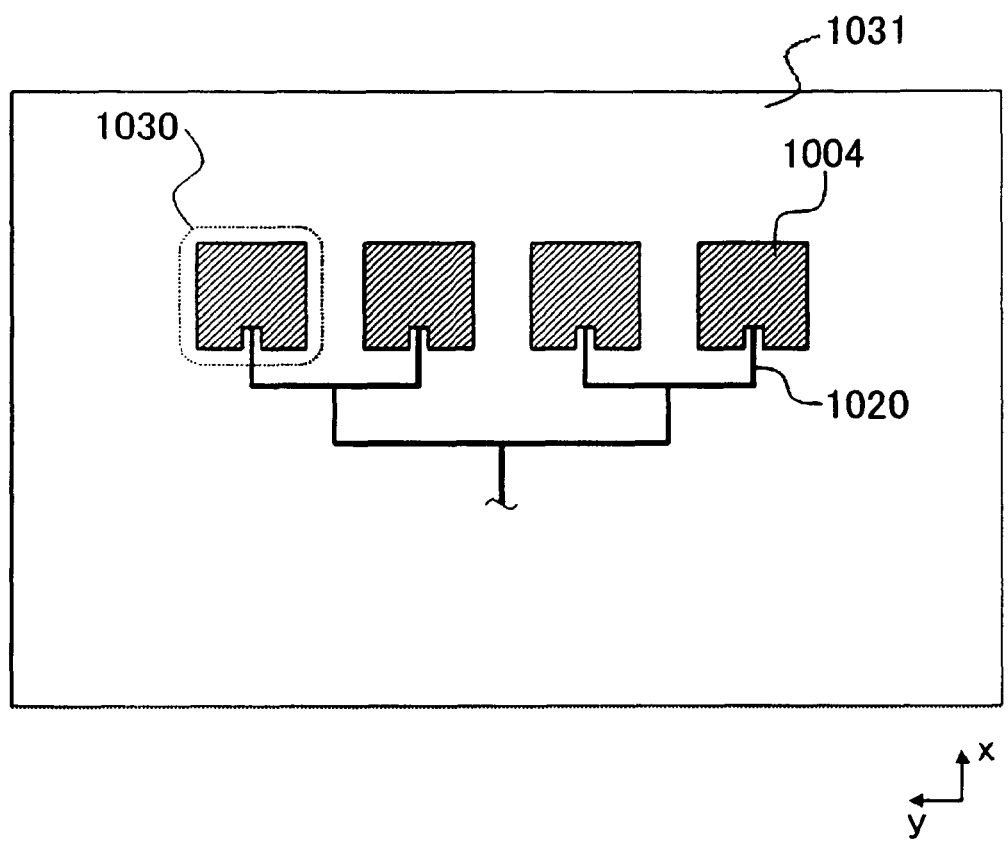
FIG. 58 is a plan view showing an antenna according to a fifteenth embodiment of the present invention.

Next, a fifteenth embodiment of the present invention will be described. FIG. 58 is a plan view of an antenna according to the fifteenth embodiment of the present invention. As shown in FIG. 58, the fifteenth embodiment is directed to an array antenna in which a plurality of array elements 1030 is aligned on a printed-circuit board 1031. This array antenna achieves a beam-shaped directivity so as to increase a gain in a beaming direction. FIG. 58 shows that four array elements 1030 each corresponding to the antenna of the thirteenth embodiment are aligned in parallel and are supplied with electric power by way of the microstrip line 1020. It is possible to use antennas of the other embodiments as the array elements 1030. Increasing the number of array elements 1030 sharpens beams and increases a gain in a beaming direction.

The antennas of the present invention are designed to repetitively align shunts including open stubs and conductive vias so as to effectively control dispersion characteristics of media, wherein dispersion characteristics of media are set to shorten wavelengths to be shorter than wavelengths of conventional dielectric substances, thus markedly reducing the sizes of antennas. The repetitive structures of the present invention serve as right-handed media so as to eliminate cutoff frequencies, thus easily lowering frequency bands.

In this connection, it is possible to arbitrarily combine the foregoing embodiments or to increase or decrease the number of parts in the foregoing embodiments. In addition, it is possible to provide electronic devices equipped with the aforementioned printed-circuit boards and/or the aforementioned antennas.

Lastly, it is apparent that the present invention is not limited to the above embodiments, but may be modified and changed without departing from the scope and spirit of the invention.

What is claimed is:

1. An antenna, comprising:
 a first conductive plane;
 a second conductive plane disposed in parallel with the first conductive plane;
 a feed line applying a high frequency signal between the first conductive plane and the second conductive plane; and
 at least one shunt which is aligned in the second conductive plane and which comprises a transmission line comprising an open end aligned in a plane above or below the second conductive plane and a conductive via electrically connecting another end of the transmission line to the first conductive plane such that the transmission line forms an open stub,
 wherein the second conductive plate undergoes a resonance at a frequency f satisfying an inequality of Im(Y(f))≥0 to emit an electromagnetic wave into air in accordance with an equation of:

$$Y(f) = \frac{1}{i\left(2\pi f L_{via} - \dfrac{Z_0}{\tan\left(\dfrac{2\pi f \sqrt{\varepsilon_{\mathit{eff}}}}{c_0} d\right)}\right)} + i 2\pi f C_{PPW}$$

wherein,
f: frequency
$L_{via}$: inductance of the conductor via
$C_{PPW}$: capacitance formed between the first conductive plane and the second conductive plane in each unit cell
$Z_0$: characteristic impedance of the transmission line
d: length of the transmission line
$\varepsilon_{\mathit{eff}}$: effective dielectric constant of the transmission line
$c_0$: speed of light in vacuum.

2. The antenna according to claim 1, wherein a distance between a bottom surface of the transmission line and the second conductive plane is less than a distance between the bottom surface of the transmission line and the first conductive plane.

* * * * *